United States Patent [19]

Allan

[11] Patent Number: 6,066,179
[45] Date of Patent: May 23, 2000

[54] PROPERTY ESTIMATION OF AN INTEGRATED CIRCUIT

[75] Inventor: Gerard Anthony Allan, Edinburgh, United Kingdom

[73] Assignee: University of Edinburgh, Edinburgh, United Kingdom

[21] Appl. No.: 08/874,953

[22] Filed: Jun. 13, 1997

[51] Int. Cl.$^7$ .............................. G06F 17/50; G06F 11/00
[52] U.S. Cl. ................................ 716/4; 700/110; 702/83; 702/181
[58] Field of Search ...................................... 364/488–491, 364/578, 468.17; 382/149; 324/718; 395/500.02–500.19; 700/108–110, 121; 702/83, 118, 81–82, 181, 185, 84, 179

[56] References Cited

U.S. PATENT DOCUMENTS

| | | | |
|---|---|---|---|
| 5,655,110 | 8/1997 | Krivokapic et al. | 395/500 |
| 5,822,218 | 10/1998 | Moosa et al. | 364/488 |
| 5,960,185 | 9/1999 | Nguyen | 395/500.1 |
| 5,991,699 | 11/1999 | Kulkarni et al. | 702/83 |

OTHER PUBLICATIONS

Allan et al. ("Efficient critical area algorithms and their application to yield improvement and test strategies", 1994 Proceedings of the IEEE International Workshop on Defect and fault Tolerance in VLSI Systems, pp. 88–96, Jan. 1, 1994).

C.H. Stapper and R.J. Rosner, "Integrated Circuit Yield Management and Yield Analysis: Development and Implementation", IEEE Transactions on Semiconductor Manufacturing, 1995, vol. 8(2), May 1995, pp. 95–102.

G.A. Allan and A.J. Walton, "Hierarchical Critical Area Extraction with the EYE tool", IEEE Workshop on Defect and Fault Tolerance in VLSI Systems, Lafayette, Louisiana, 1995, pp. 28–36.

P.K. Nag and W. Maly, "Hierarchical Extraction of Critical Area for Shorts in very large scale ICs", IEEE Workshop on Defect and Fault Tolerance in VLSI Systems, 1995, Lafayette, Louisiana, pp. 19–27, Jan. 1, 1995.

H.T. Heineken and W. Maly, "Manufacturability analysis environment—MAPEX", Custom Integrated Circuits Conference, San Diego, CA, 1994, pp. 309–312, Jan. 1994.

S.M. Domer, S.A. Foertsch and G.D. Raskin, "Component Level Yield/Cost Model for Predicting VLSI Manufacturability on Designs Using Mixed Technologies, Circuitry, and Redundancy", Custom Integrated Circuits Conference, San Diego, CA, 1994, pp. 313–316, Jan. 1994.

*Primary Examiner*—Paul R. Lintz
*Assistant Examiner*—Phallaka Kik
*Attorney, Agent, or Firm*—Dann, Dorfman, Herrell & Skillman, P.C.

[57] ABSTRACT

A method and apparatus to estimate properties of an integrated circuit device utilizes reduced resources. The representation of an integrated circuit is sampled using the statistical techniques of survey sampling. An average value of a property is determined from these samples and used to determine the property of the integrated circuit as a whole. Thus a property of an integrated circuit is determined from an analysis of a fraction of the integrated circuit representation. Error bounds associated with the property can be optionally determined from the estimated variance of the sampled property measurements. The method is realized using a general purpose computer. The invention has application to the estimation of integrated circuit manufacturability, yield and other properties.

15 Claims, 20 Drawing Sheets

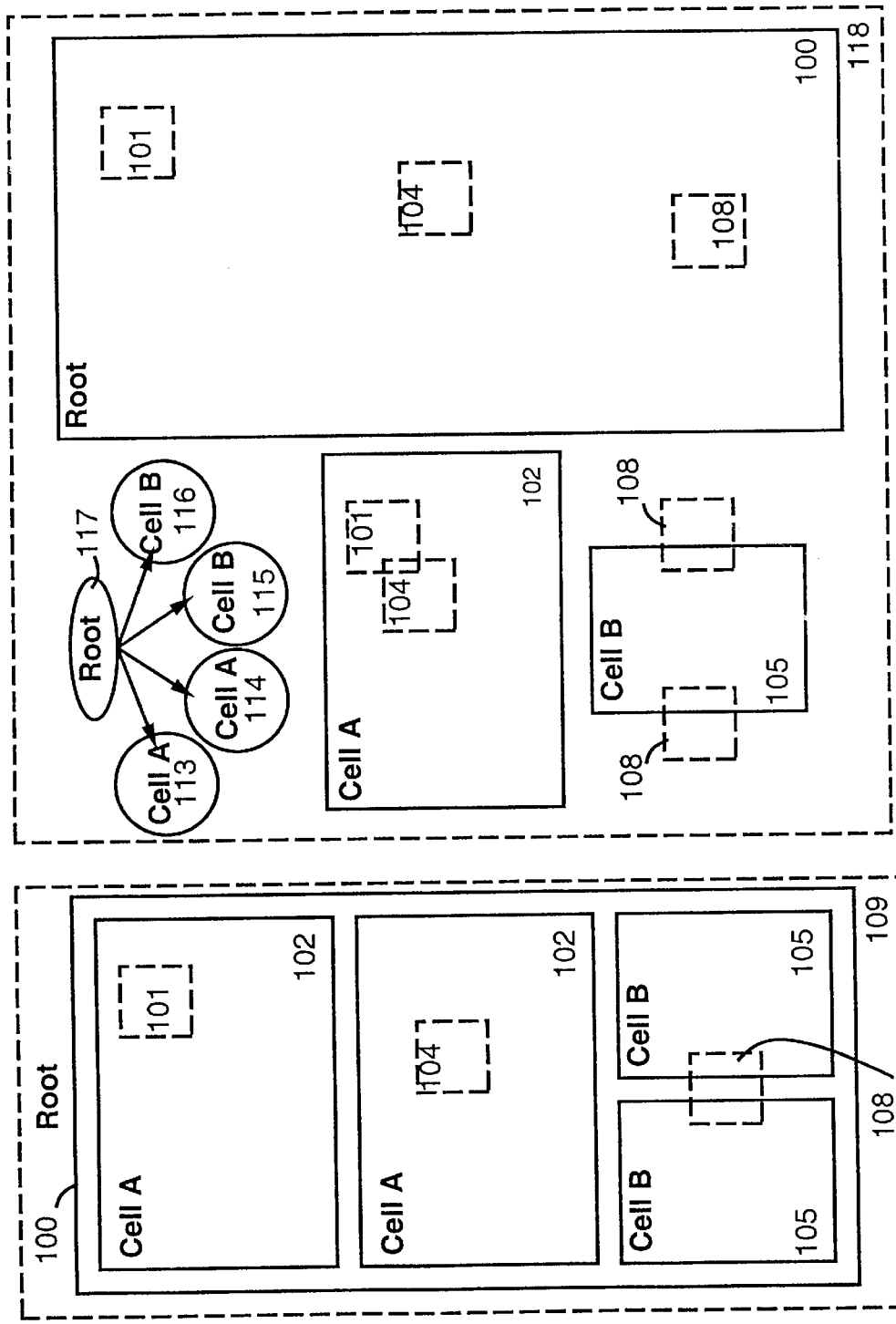

PROPERTY ESTIMATION OF AN INTEGRATED CIRCUIT

BACKGROUND TO THE INVENTION

1) Field of the Invention

This invention relates to the design and manufacture of integrated circuits and more particularly to a method of estimating properties of an integrated circuit.

2) Description of the Background Art

In the design and manufacture of integrated circuits it is required to estimate particular properties of an integrated circuit. An example of such a property is the sensitivity or susceptibility to extra material defects. Extra material critical area is a measure of an integrated circuit layout geometry that defines the susceptibility of the device to extra material defects of a given size. Such defects are small randomly occurring particles of foreign matter, of varying size, present in the manufacturing process. These defects can fatally damage an integrated circuit during manufacture. It is common practice to extract and compute a value for extra material critical area for a range of discrete defect sizes. These results are combined to give an estimate of the susceptibility to extra material defects as a whole. Those skilled in the art can combine knowledge of the defects within the manufacturing process with the susceptibility to these defects to estimate the associated yield loss. A similar treatment can be applied to other defect types, such as missing material, pinhole, inter-level dielectric defects and defective contacts and vias. The susceptibility of the integrated circuit to a range of defect types and the levels of these defects within the manufacturing process can be used by those skilled in the art to estimate the manufacturing yield of the device. This can in turn be used to estimate the cost of production and also the number of devices that must be manufactured in order to produce the required number of working devices.

The determination of the susceptibility of an integrated circuit to defects is commonly obtained by a computer analysis of the integrated circuit mask layout. It is not uncommon for such an analysis to require hundreds of hours of computer time and a large amount of computer memory. A substantial cost must be incurred to estimate these properties and other properties of an integrated circuit.

Techniques have been developed to speed up the required computer analysis by the use of a network of computers which execute the task as sub tasks in parallel. This has the obvious disadvantage that a network of computers must be provided at high cost. There is also the additional burden of managing the distribution of the calculation over the network, which is typically in use by other users for different applications.

Another method commonly used to reduce the time to extract properties is to exploit the hierarchy of the integrated circuit design. In its simplest form the interactions between cells, i.e., discrete areas of the design, are ignored. The technique consists of an analysis of each cell within a design to estimate the property of the cell. This property is then multiplied by the number of copies of the cell within the design. The technique is limited by the nature of the design hierarchy. Integrated circuits that are largely made up of multiple copies of a single or a few cells can be analysed quickly. However, many integrated circuit devices do not follow this pattern. Designs may be composed of a single large cell, or a collection of cells routed together within a single large cell. Other designs are composed of a large number of different cells that may only have a single or few copies within the design. This is particularly true of the more complex high value parts, where each cell is tuned to optimize performance. Consequently, the speed up may not be large.

The simplest form of hierarchical extraction ignores interactions between cells. This almost always leads to a degree of inaccuracy. The level of inaccuracy is not easily predicted, and can be large. Consequently, it is not possible to use the results with confidence. In more complex embodiments interactions between cells are included. This ensures that the results are accurate, but at a cost. The implementation is considerably more difficult. The analysis takes longer since the interaction region, which can be large, must also be processed. It is even possible for the results of a hierarchical analysis, including interactions, to take longer to process than a flat representation. This can occur where the total of the cells plus their surrounding interaction region are greater than a flat representation. This situation is becoming even more likely with the increase in routing levels and the use of automated routing over cells at different levels in the hierarchy.

Even exploiting the hierarchy of a design the extraction of device properties can still take a considerable time. The hierarchical technique has been combined with parallel extraction. This is an obvious extension since that extraction is naturally broken into a number of separate tasks, the extraction from individual cells and their interaction region. These tasks can be accomplished in parallel using a network of computers. This is a costly solution in that it combines a complex implementation with costly hardware. Both the complex software and its use within a network, which can be subject to change, must be maintained at substantial cost.

Another technique used to extract properties of an integrated circuit layout is for a person skilled in the art to analyse the representation and select a region that is characteristic of the device as a whole, or some significant part of the device. This kind of solution can be used where a design, or a block within the design, largely consists of similar cells. For example standard family cells may be connected by routing. A region that appears characteristic of the whole is selected. An analysis of this region is used to approximate the whole design or block. The technique is effectively an extension of the hierarchical extraction technique, in that it attempts to chose a representative region that is assumed to have a number of similar occurrences throughout a device or a specified part of the device.

The disadvantage of this approach is that it requires a person skilled in the art to select an appropriate characteristic block or blocks. A further disadvantage is that results based on this approach can be very variable depending on the skill of the practitioner, the actual layout and characteristic region selected. It is also difficult to determine how much reliance can be placed on any estimate. Also, not all integrated circuit designs are suitable for this method since they may be highly variable and not contain blocks that obviously contain similar cells or characteristics.

The technique of characterising layout has been extended to the characterisation of particular design environments used for automated integrated circuit design, in particular, to compare the manufacturability and other characteristics of different design environments. This is achieved by extracting the characteristics of a range of variably sized partitions of one or more integrated circuit layouts that have been generated by the design environment. An obvious extension of this is to use the results to estimate properties of a design based solely on the area of the design. This can be an efficient method of estimating device properties. However, it has a number of limitations. The most obvious limitation is that a design must be composed using a known and characterized design environment. Not all design environments will be simple to characterize, particularly where they are not limited to special applications. Sections of a design created with different design environments must be treated separately and the results combined. Where a design contains parts that are not from a characterized environment, an estimate of properties must be generated by other means. Many designs are composed of parts of existing designs which may have been produce in different design environments and merged. The history of the various parts is not always available and so cannot be used to estimate device properties. In general the technique is only of use where a standard design method is used and a similar class of integrated circuit are designed.

SUMMARY OF THE INVENTION

In accordance with the present invention, a system and method are disclosed for property estimation from an integrated circuit reducing the computational resource required for the estimation procedure. The invention generally involves the sampling of a representation of the integrated circuit to estimate a mean value of the property of interest for these samples. This mean is then used to estimate the property of the integrated circuit as a whole. An estimate of the error in this property estimate can be determined from the variance of the property mean obtained from the samples.

Property estimation by sampling is based on the statistics of survey sampling. Properties of a population are estimated with bounds on the error of estimation by taking a number of random samples from the population. For example, the estimator of the whole population mean, $\mu$ is given by the sample average $\bar{y}$, $$\hat{\mu} = \bar{y} = \frac{\sum_{i=1}^{n} y_i}{n}$$

The estimated variance of $\bar{y}$ is given by:

$$\hat{V}(\bar{y}) = \frac{s^2}{n}\left(\frac{N-n}{N}\right)$$

where N is the population size, n is the number of samples and $s^2$ is the sample variance, $$s^2 = \frac{\sum_{i=1}^{n}(y_i - \bar{y})^2}{n-1}$$

The bound on the error of estimation is given by:

$$2\sqrt{\hat{V}(\bar{y})} = 2\sqrt{\frac{s^2}{n}\left(\frac{N-n}{N}\right)}$$

An integrated circuit device can be viewed as a population of regions each with varying properties. The property of the device as a whole can be estimated by randomly sampling a representation of the device. Survey sampling is particularly suited to integrated circuit property estimation since, for large populations, the error bound on estimates does not depend on the population size but on the variance of the population. This implies that the number of samples required to characterise very large devices does not increase with device area or even complexity but only with the variation of the property over the device. For large integrated circuits property estimates with small error bounds can be obtained from a detailed analysis of a fraction, commonly less than 1%, of the integrated circuit representation.

In order to estimate integrated circuit properties from small samples of an integrated circuit representation, it is necessary to ensure that property measurements from the sample correspond with a good degree of accuracy to the same property when measured within the whole representation. For some properties this does not require any significant modifications. Other properties can only be effectively measured by using other information to generate a valid representation and valid measurement region. Such properties include connectivity information, interaction of distanced features, and the number of features.

The benefits obtained from the present invention exceed the expectations of even the inventor. It is now possible to extract properties of large commercial integrated circuits (1,000,000 transistors) in a reasonable time with standard computer resources. In one study, a typical extraction time was 90 minutes using 4096 samples. The same extractions using a hierarchical implementation that ignores cell interaction had taken many tens of hours. These hierarchical extractions also required large amounts of memory and as a result used a computer specially configured for memory intensive applications. A flat extraction was not feasible on such large designs with the available computing resources. The memory requirements for flat extractions are very large. Results from others in this field suggest that typical flat extraction times are in the order of hundreds of CPU hours. This can be much longer in real time, depending on the availability of RAM in the computer running the extraction. The accuracy of the sampled results obtained is significantly greater than a hierarchical extraction, which ignores cell interaction. Sampling can also give more accurate results than a flat extraction because it is feasible to use more rigorous extraction algorithms. For example critical area extractions normally assume a square defect model. Using a sampled extraction, an approximated circular defect model can be used that gives a more accurate result in a shorter time, with lower memory resource requirements than an equivalent square defect model flat or hierarchical extraction. The greater accuracy is a result of the fact that the sampling error is less than the systematic error associated with a square defect model.

The practical application of the present invention is not limited by the design hierarchy, the size of the device or the design environment used to produce the design. The preferred embodiment of the present invention can be used even by those of ordinary skill. Sample regions are selected without any special knowledge of the device and the preferred embodiment hides the implementation details from the user.

The significant increase in execution speed and lower memory requirements permitted by the present invention make possible the practical application of more rigorous techniques. Such techniques are not generally considered practical because of the time and/or computer memory requirements. They include, but are not limited to, the use of circular defects in critical area extraction; more accurate two dimensional representation of the device; three dimensional representation; lithography simulation; and extraction of accurate three dimensional properties.

Sampling also permits analysis of modifications to the integrated circuit design itself, for example, layout modifications such as: the insertion of redundant contacts; track displacements; track width increases etc., used to increase device robustness and enhanced yield. An estimate of the possible number or amount of such modifications can be made. The consequences of these layout modifications on devices properties either directly affected or indirectly affected can also be estimated.

The method also has the advantage that complex and costly modifications to the sample layout geometry can easily be implemented in parallel since the problem is already neatly broken down into a large number of small parts, the sample regions.

BRIEF DESCRIPTION OF THE DRAWINGS

FIG. 5a shows a flat representation of an integrated circuit layout;

FIG. 5b shows the corresponding hierarchical representation;

DETAILED DESCRIPTION OF THE PREFERRED EMBODIMENT

Figure 1:
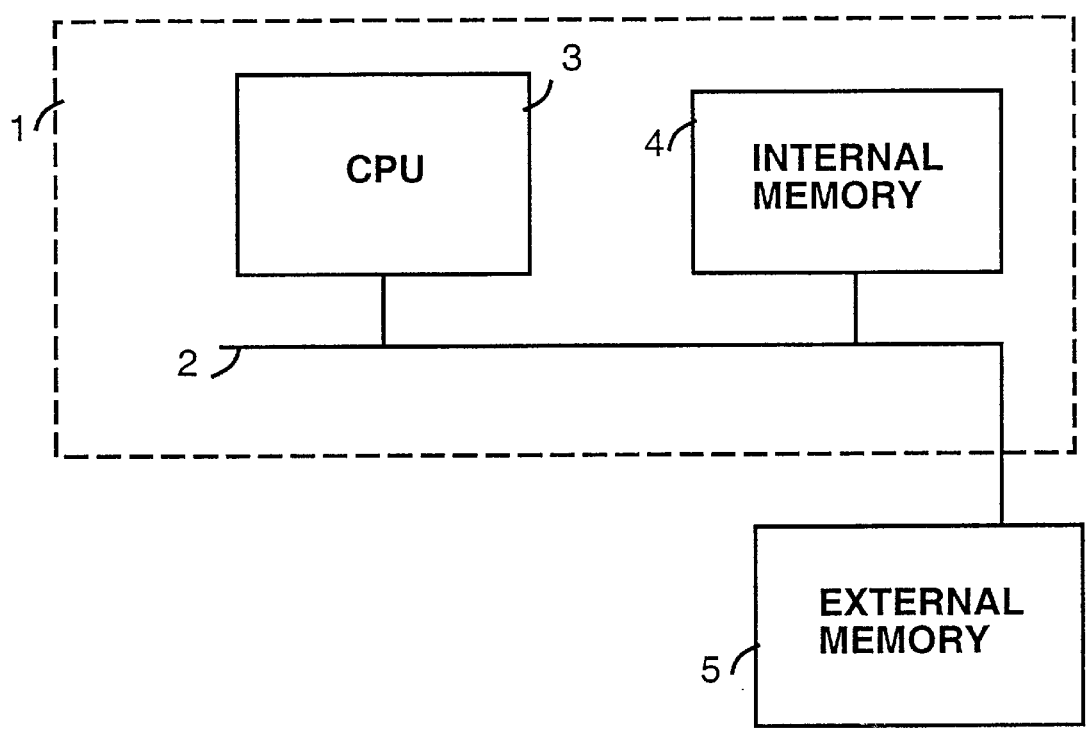
FIG. 1 is a block diagram of the preferred computer architecture used in the property estimation system of the present invention.

An integrated circuit can be represented by a set of mask layers, that define transistors, conductors, and connections between conductors. These mask layers commonly consist of a set of polygons that define the individual features of the device. The present invention is a method of estimating properties of these mask layers that does not require the analysis of each polygon. The mask layout of the device is treated as a population for which an average value of a property can be obtained by examining a large number of small samples of the mask layout. The structure of the present invention is preferably implemented on a general purpose computer 1 with a high level architecture such as shown in FIG. 1. The computer 1 includes a CPU 3 and internal memory 4 and is connected to external memory 5.

General Outline

Figure 2:
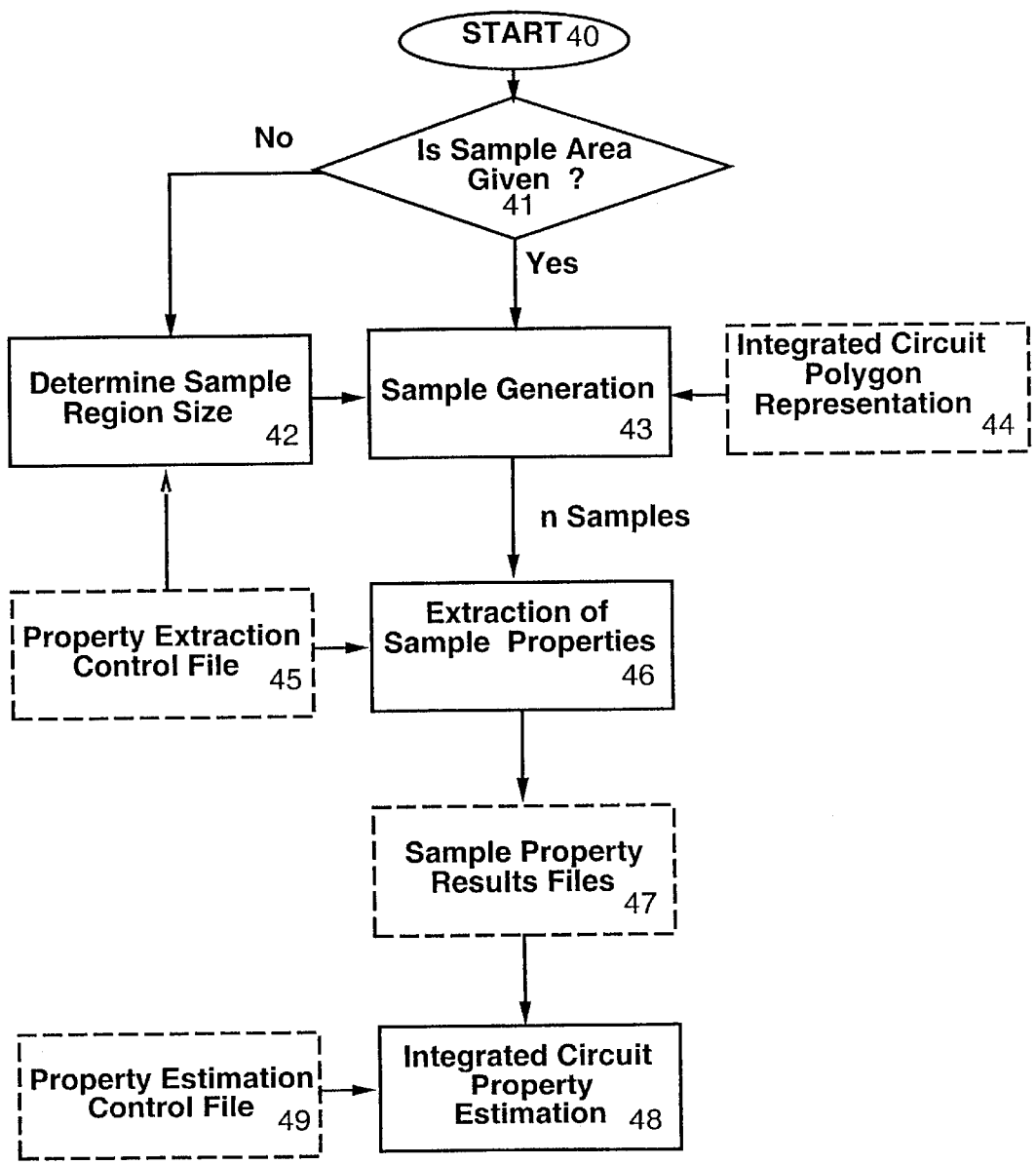
FIG. 2 is a flowchart showing the method steps for the preferred embodiment of the present invention of integrated circuit property estimation by sampling.

FIG. 2 shows a flow chart representation of the method steps of the preferred embodiment of the present invention for estimating properties of an integrated circuit. Beginning at step 40 the CPU 3 starts the analysis. In this example the sample regions take the form of a square. The first requirement is to determine the size of these square sample regions that are to be extracted from an integrated circuit representation 44. The CPU 3 determines in step 41 whether the sample region size has been supplied by the user. If no sample region size has been supplied then it is determined in step 42 by analysing a property extraction control file 45. This file is in the form of an interpreted script language. The script language is used to describe the sequence of operations to be applied to the samples and the properties to be measured. The script language is a high level language that hides the complex implementation details from the user. Property measurement statements describe the properties to be extracted, the mask layers from which the properties are extracted, and where appropriate measures of space, width or size. The measure information relates to the integrated circuit design rules and is an indication of the minimum separation, minimum width or size of polygons in a particular layer. The width, space and size information are required to make the appropriate property measurements, but can also be used to determine the required sample region size. In the determine sample region size step 42 the property extraction control file 45 is analysed to find the largest minimum feature size. This is the largest value contained within any of the width, space or size statements. The size statements take the form of a pair of numbers, the width and height, that define an area. The largest minimum feature size is used to compute the required sample region size. In the preferred embodiment, where the sample region size is not supplied by the user, the sample region is calculated to be a square of side 17 times bigger than the largest minimum feature size. This sample region area is commonly many tens of thousands times smaller than the integrated circuit area. Where the user supplies the sample region size directly it is in the form of a value representing the largest minimum feature. That is, this value is multiplied by 17 within the CPU 3 to determine the size of the side of the square sample region to be used.

Once determined, the sample region size is used in a sample generation step 43. In the sample generation step 43 a number of samples, n, are generated. The number of samples is specified by the user by means of a value indicating the sampling level. The samples are taken from a hierarchical integrated circuit polygon representation 44, commonly in the form of an industrial standard GDSII file, stored in the computer's external memory 5. The next step is the extraction of the sample properties from these samples at 46. The required properties, as contained within the property extraction control file 45, are computed by the CPU 3. The property measurements for each property are stored in the computer's external memory 5 in the sample property results files 47. The next step is integrated circuit property estimation at 48. In this step a property estimation control file 49 and the sample property results files 47 are used to estimate the properties of the integrated circuit as a whole. The property estimation control file 49 is in the form of an interpreted script language which details the properties to be computed and other information required to estimate the properties. The properties that are extracted generally relate to sensitivity to defects. The property estimation control file 49 provides data, such as yield models and process defect statistics, that are combined with the property estimates of the integrated circuit defect susceptibility to give an estimate of device yield. The user can optionally generate a full report of the the actual defect susceptibility property estimate information where required.

The property estimation step 48 generates a value for the properties of the integrated circuit using the well known statistics of survey sampling. The variance of the sampled properties is also computed and is used to give estimates of the error bounds on the computed properties. The integrated circuit property estimation step 48 is performed by a separate program that can be used independently to analyse the sample property results files 47. The integrated circuit property estimates generated from the sample property results files 47 are commonly re-computed many times for different yield models and defect statistics. An independent program for method step 48 also enables properties generated by separate sampled extraction runs to be combined.

The method steps sample generation 43, extraction of sample properties 46 and integrated circuit property estimation 48 will now be explained in greater detail.

Sample Generation

The number of samples that can be selected is restricted to certain values. The user selects a sampling level L. The number of samples generated, n, is given by the formula:

$$n = 512 \times 2^{L-1}$$

In general the appropriate sample region size is related to the technology scaling of the integrated circuit and the properties of interest. Larger sample regions provide more information but take longer to process, smaller sample regions while providing less information individually can be processed more quickly so that more of them can be processed in a given time. It has been found that the best results are obtained by using a large number of small samples. A typical extraction using the preferred embodiment of the present invention uses a sampling level of 4, i.e. 4096 samples. The sample area used in the preferred embodiment is chosen for the particular properties that are estimated. A square of side 17 times the largest minimum feature size is preferably used because it enables estimates of extra and missing material critical area over a range of the relevant defect sizes. In general the best sample region size will be depend on the nature of the property or properties that are to be extracted.

The samples regions are extracted from a representation of the integrated circuit. One integrated circuit representation that is commonly used is in the form of a list of polygons which are grouped into cells. A single cell, the root cell, can reference other, lower level or child, cells. Cells which contain child cells are known as parent cells. Child cells may in turn be a parent to other cells. Cells which contain no child cells are known as leaf cells. Parent cells cannot contain references to themselves either directly or indirectly via a child cell. An example of this representation, known as a hierarchical representation, is the industrial standard GDSII format. A hierarchical representation is commonly used for integrated circuit layout representation because it can very significantly reduce the size of the representation. Where possible, the structure of a hierarchical representation is used to reduce the amount of internal memory 4 required to generate the large number of layout samples that are required. Where a design has no hierarchy to exploit, the samples are taken from the flat representation.

Figure 3:
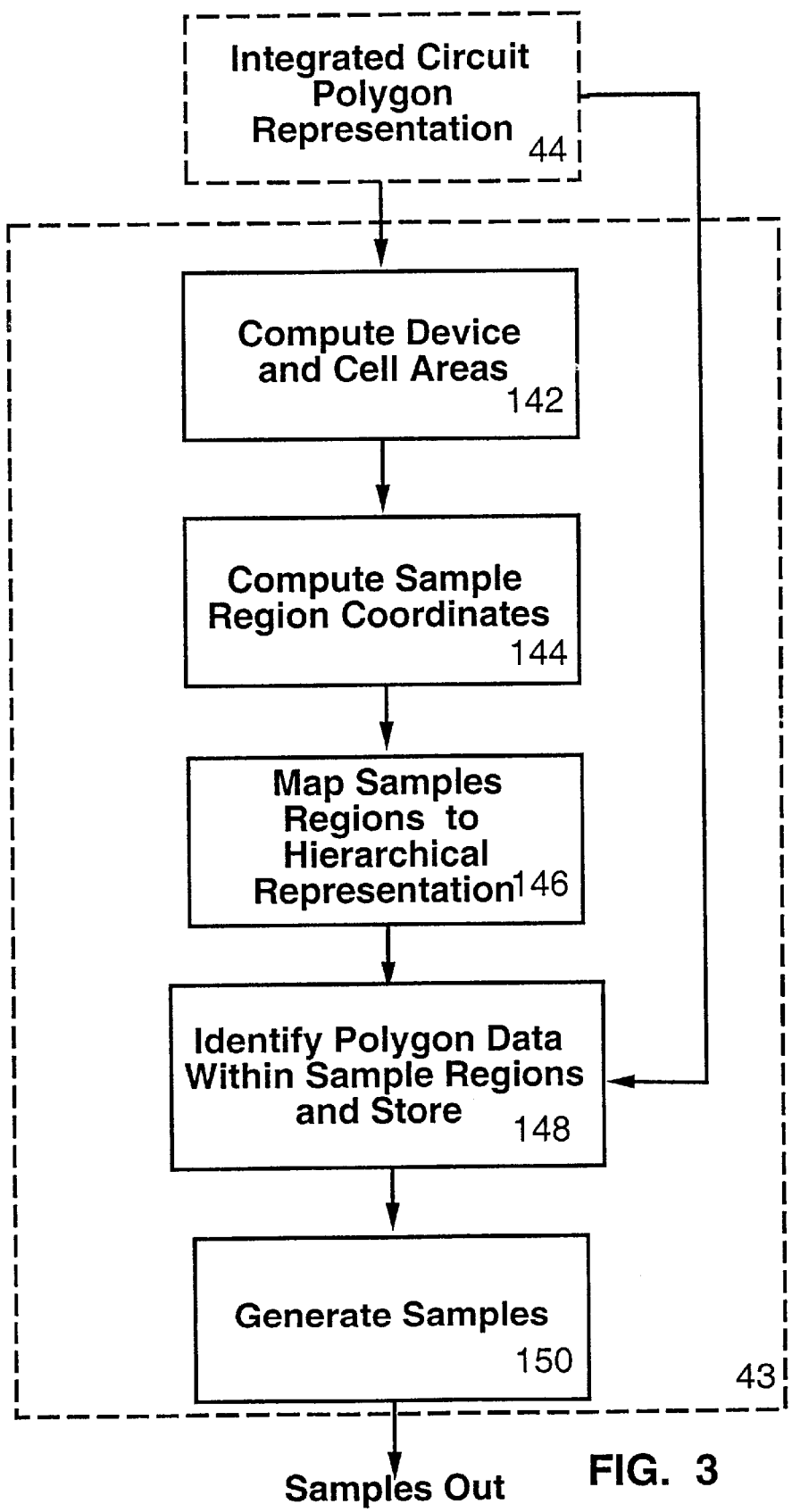
FIG. 3 is a flowchart showing the method steps for sample region generation.

FIG. 3 shows a high level representation of sample generation step 43. The first step 142 in generating the samples is to compute the device extent and the extent of all the cells and their positions within the hierarchy of the device. This is achieved by the CPU 3 reading the integrated circuit hierarchical polygon representation 44. The maximum and minimum extent of each polygon is computed and compared to the maximum and minimum extents of its parent cell. Where the polygon maximum extent is greater than the parent cell maximum extent, the parent cell maximum extent is made equal to the polygon maximum extent. Similarly, where the polygon minimum extent is less than the parent cell minimum extent, the parent cell minimum extent is made equal to the polygon minimum. The data representing the polygon is then discarded from the internal memory 4 and another polygon is then processed by the CPU 3. When all the polygons have been processed, the extents of all the leaf cells have been determined. Parent cell extents are then updated to account for the extent of the child cells that they contain. At this stage no layout polygons are stored within the internal memory 4 of the computer.

Figure 4:
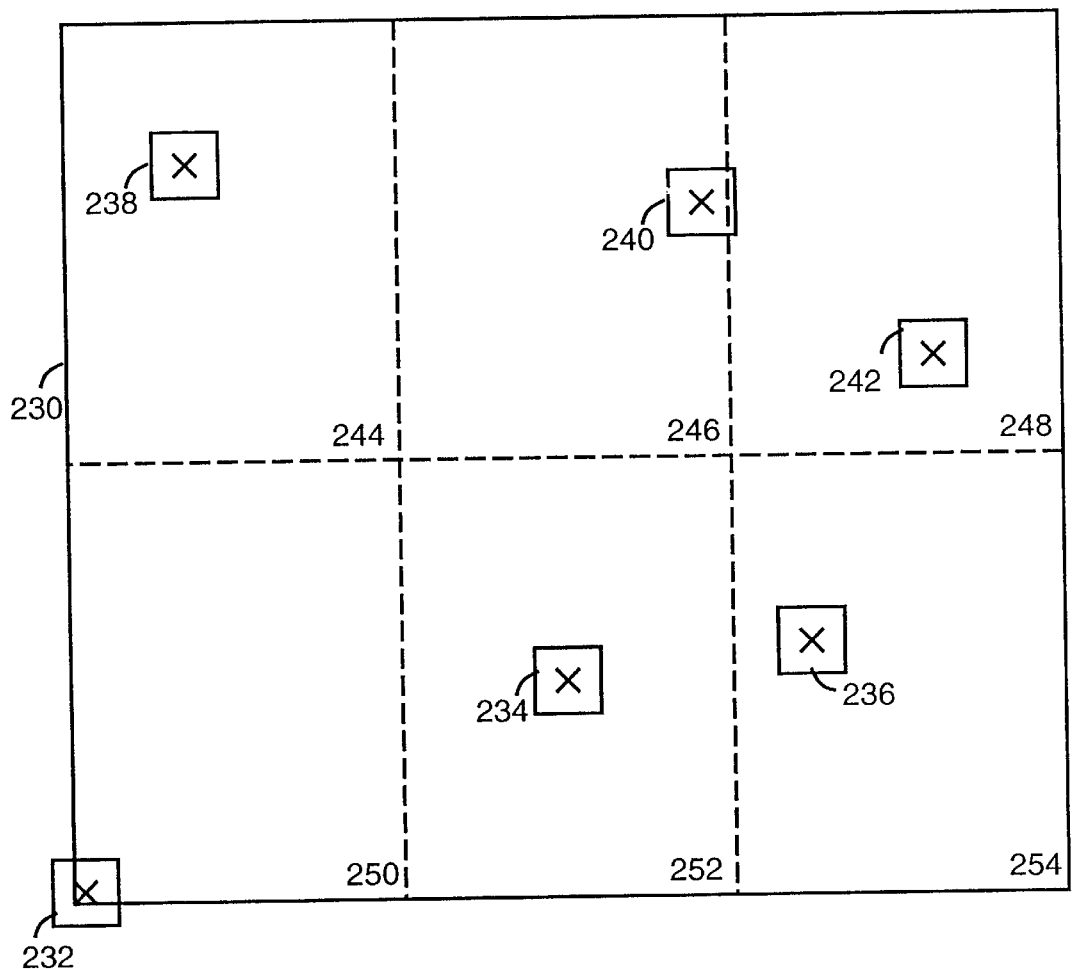
FIG. 4 is a representation of an integrated circuit layout illustrating sample region selection from the layout which has been divided into regular device regions.

Referring now to FIG. 4, the computed device area 230 is divided up into a regular array of n equally sized rectangular device regions 244, 246, 248, 250, 252, 254 that fill the device area, where n is the number of samples required. A single random coordinated position within each of the device regions is generated. These coordinate position represent the center of the sample regions 232, 234, 236, 238, 240, 242 that are to be extracted from the integrated circuit layout. This sampling strategy results in a more even distribution of samples than an equivalent simple random sample and in general better property estimation. It also has the advantage that results can be presented on a grid, generating a map of device property variation throughout the device.

The next step is to map the samples to the hierarchical representation of the device 146.

FIG. 5(*a*) shows a flat representation of an integrated circuit design 109. This design consists of two cells, Cell A 102 and Cell B 105 contained within the root cell, Root 100. There are two copies of each of these cells within the design 109. An alternative representation of the same design is given in FIG. 5(*b*). FIG. 5(*b*) shows a hierarchical representation of the design 118. This representation also contains Cell A 102 and Cell B 105 and the root cell Root 100. The hierarchical design 118 does not however contain two copies of cells Cell A and Cell B as in the flat representation 109. The hierarchical design is defined by references 113, 114, 115, 116, 117, to a single copy of each cell. A reference includes information on the position and orientation of the cell within the hierarchical representation. The sample coordinates computed at step 144 are correctly positioned for a flat representation of the design. FIG. 5(a) shows sample regions 101, 104 and 108 positioned within a flat representation 109. These sample regions also have a mapping within a hierarchical representation, as shown in FIG. 5(b). Where a design has hundreds or thousands of copies of the same cell many sample regions may fall within different instances of the same cell, such as 101 and 104 of FIG. 5(b). By mapping the sample regions to a hierarchical representation many of these sample regions overlap. Even where samples do not overlap the close proximity within a cell increases the likelihood that a polygon may straddle more than one sample region. Using a hierarchical representation reduces the total number of polygons that need to be stored in internal memory 4 as samples can effectively share polygons within the hierarchical representation. These shared hierarchical polygons are transformed, by the CPU 3, to the appropriate position and orientation within a flat representation when required. Where there is no hierarchy to exploit the method defaults to sample regions within the root cell.

Referring again to FIG. 3, after mapping of the sample coordinates to the hierarchical representation 146 the next step is to read in the polygon data 148. Only those polygons that interact with a sample region are stored in internal memory 4. Other polygons are discarded. The result in internal memory 4 after this step has been completed is a sparse hierarchical representation of the device in which only those polygons that are required by at least one sample are present. The next step is to generate the layout samples of the device 150. This is accomplished for each sample by searching the sparse hierarchical representation for all the geometry that falls with the sample region. These samples are then ready for the sample property extraction 44 step.

The samples may be generated by a separate program which delivers the samples to the property extraction program. This delivery is commonly via a UNIX pipe mechanism. The technique is used to provide a convenient mechanism by which samples can be piped through other programs before being presented for property extraction. The technique also has the advantage that the samples can be generated by an associated networked computer, executing sample generation and extraction in parallel.

The Sample Region

In order to make accurate estimates of the integrated circuit properties it is often necessary to prepare the sample data to have a more accurate correspondence with the actual integrated circuit as manufactured. A mismatch between the representation and the actual device can result in inaccurate property measurements. In general the level of accuracy required will depend on the use of estimated property. Those skilled in the art can determine the level of accuracy and the necessary level of mismatch between the representation and the device that can be tolerated.

There are a number of possible operations that can be applied to the sampled layout to increase its correspondence to the integrated circuit device. These include the sizing of the polygons and the generation of new layers. Integrated circuit polygon representations are commonly designed without an exact correspondence to the final mask layout or physical features that appear on the final silicon. In mask generation some layers are oversized, other layers may be undersized and other new layers may be generated from a combination of existing layers. On the silicon itself the layers may not correspond to the mask layers, and again size operation may be required to compensate for these differences. Other modifications may be used to enable complex properties of the layout to be estimated.

Unless precautions are taken, the sizing and other modifications can change the layout within the sample inappropriately, such that it is not properly representative of the integrated circuit after the same operation.

Figure 6A:
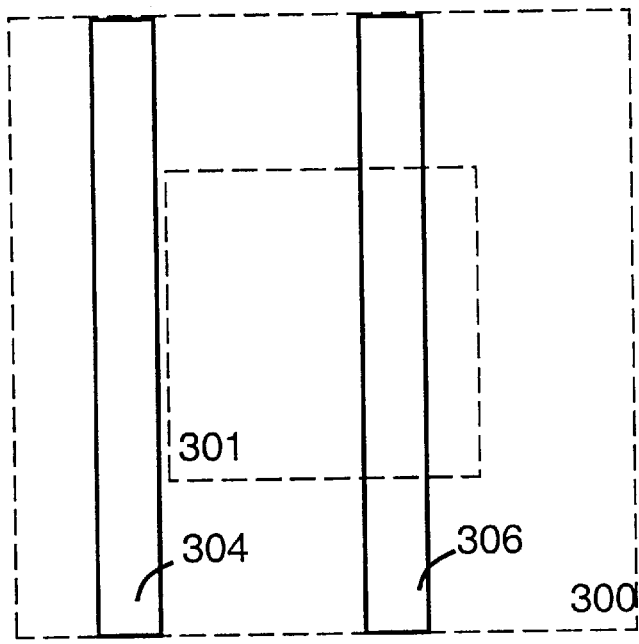
FIGS. 6a to 6f show the effect of sizing operations on polygon geometry within a sample region.
Figure 6B:
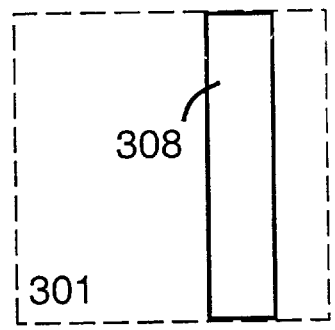

FIG. 6(a) shows an integrated circuit layout 300 which contains only two polygons 304 and 306. A sample region 301 is marked within the layout 300. The extracted sample 301 is shown in FIG. 6(b). Polygon 308 corresponds to polygon 306. When a polygon shrink or undersize operation is applied to the layout of FIG. 6(b) the result is that shown in FIG. 6(c), where polygon 310 corresponds to polygon 308. The layout of FIG. 6(c) does not properly represent the integrated circuit layout 300 after a shrink. FIG. 6(d) shows the required representation. Similarly, FIG. 6(e) shows the sample region layout after an expansion, or oversize operation. This again does not does not properly represent the integrated circuit layout 300 after an expansion operation. FIG. 6(f) shows the required representation, where there are two polygons. Polygon 316 corresponds to polygon 308 which in turn corresponds to polygon 306 of FIG. 6(a). The second polygon 318 was not present in the sample region 301 but corresponds to the part of the polygon 304, from the integrated circuit layout 300, which has been expanded and moves into the sample region 301 and should therefore have been represented within the sample. This problem can be solved by providing a buffer region or skirt, surrounding the sample core or measurement area.

Connectivity

A buffer region also helps with other operations that need to be applied to the sample to ensure that the layout in the measurement region is valid. An important operation for many properties is to tag polygons with electrical node information. In a sample of layout from an integrated circuit mask layout the connectivity of the polygons present can be defined by tracing the connections between polygons by a variety of methods known to those skilled in the art. However some of the relevant information required will not be present since some connections will be made outside the sample region. In some cases it is not possible to correctly determine connectivity without analysing the whole layout. This is particularly true for test structures which can be made up of a single large polygon or a large number of interlaced interconnected polygons. However, in general, for functional integrated circuit designs it has been found reasonable to assume that where there are no local connections adjacent polygons are not part of the same node.

A similar situation prevails for other types of connectivity such as that used to define non-redundant vias or contacts. A via is non-redundant if it connects two polygons that are not connected together by any other vias. Thus in this situation vias can be considered to be connected to two polygons. A via connects to two polygon of different layers. Where a via is the only via to connect the same pair of polygons it is non-redundant. That is, no other via performs the same connection function. In functional circuits a second or third via connecting the same two polygons will in general be local to the first via. Accurate via and contact non-redundancy information can be generated by providing a buffer region or skirt surrounding the sample core or measurement area. This region provides information local to the sample measurement region.

The Sample Region Structure

Referring now to FIG. 7, to ensure that all local connections are found and that modification and sizing operations do not generate invalid data, a region of the sample region 260 known as the sample skirt 261 is provided. This region performs two functions. One function is to act as a buffer region, so that modifications to the sample geometry can be performed in such a way that the geometry within the measurement region 262 is in correspondence to the integrated circuit layout, as if the same operations had been applied to the integrated circuit layout as a whole. The second function is to provide connectivity data from a larger region than the measurement region 262 alone. In the preferred embodiment connectivity data is inferred from the position of contacts, vias, transistors and conductors, represented by polygons.

Figure 7A:
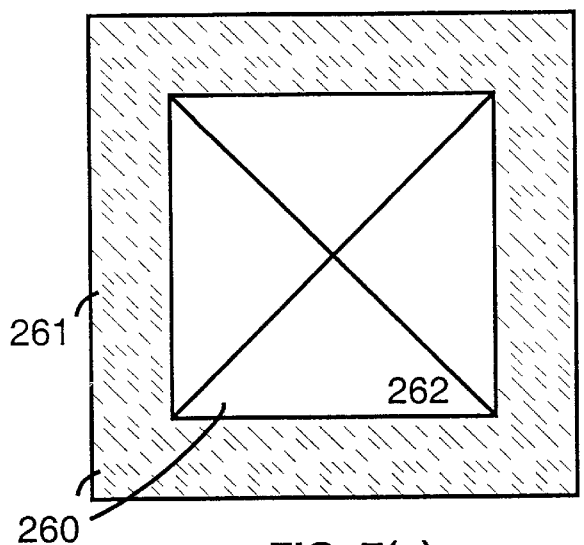
FIGS. 7a to 7d show the parts of a sample region, the sample measurement area and the sample skirt.
Figure 7B:
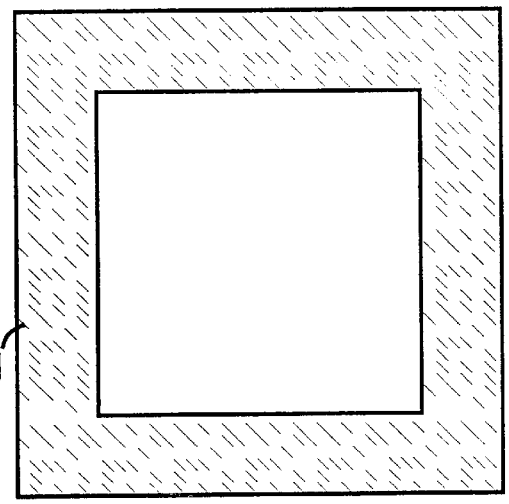
Figure 7C:
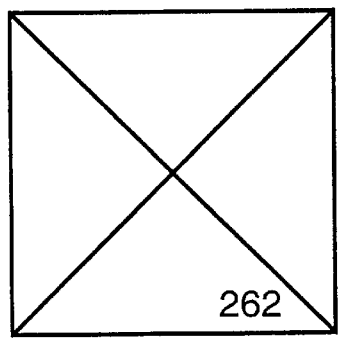
Figure 7D:
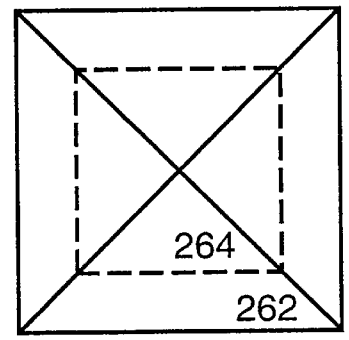

FIG. 7(d) shows the measurement region 262 and another region, the valid measurement region 264. The valid measurement region 264 is a variably sized region. By default it is the whole of the measurement region 262. However, for some property measures it may be smaller, but non zero. The valid measurement region is the region in which property measurements are valid. The measurement region 262 is the region in which the layout geometry and connectivity information is assumed valid. For simple properties such as the area of a layer formed by a Boolean operation, the valid measurement region 264 is the same as the measurement region 262. However, some properties are obtained from measurements of polygons that are only valid within a smaller region of the measurement region. In general such properties are those that are generated by the interaction of polygons at a distance and some polygon number properties. This will be discussed in more detail later.

Figure 6C:
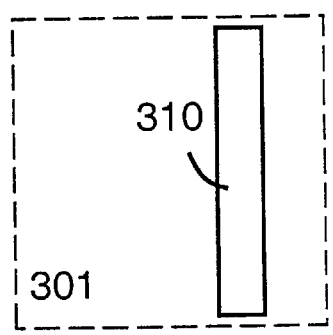
Figure 6D:
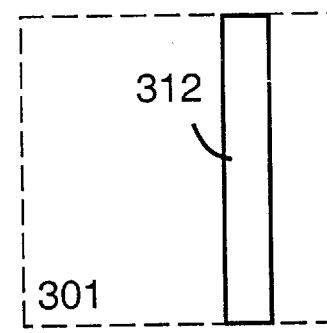
Figure 6E:
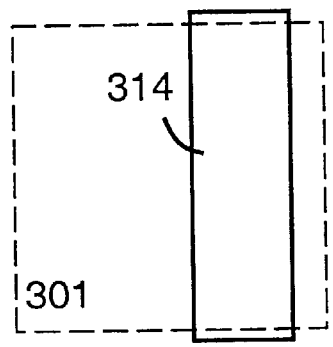
Figure 6F:
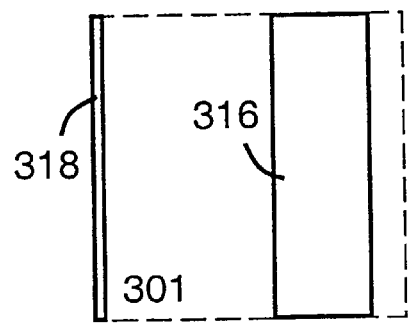
Figure 8A:
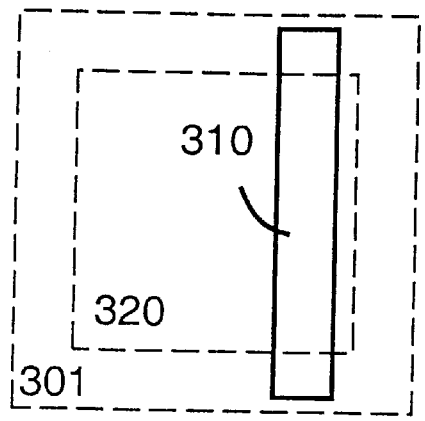
FIGS. 8a to 8d show the use of a sample skirt to ensure that valid geometry exists within a sample measurement region after sizing operations on polygon geometry.
Figure 8B:
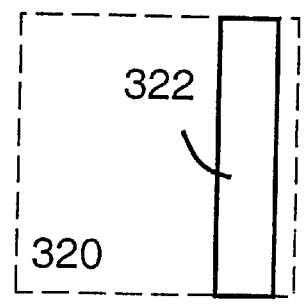
Figure 8C:
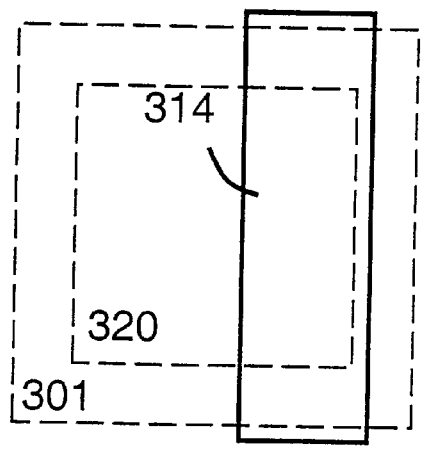
Figure 8D:
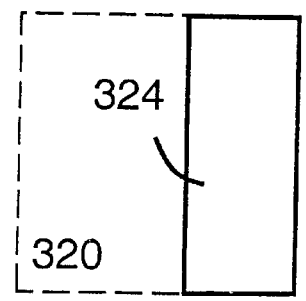

FIG. 8(a) shows the same sample region 301 as FIG. 6(c), with the exception that there is a smaller inner region 320 present. This inner region corresponds to the measurement region discussed above. FIG. 8(b) shows the polygon 310 of FIG. 8(a) clipped to the inner region 320 resulting in polygon 322. This polygon accurately represents the corresponding layout within the integrated circuit layout 300, were a similar polygon shrink operation to be applied to the whole layout. Similarly, FIG. 8(c) shows the same sample region 301 as FIG. 6(e), with the exception that a smaller inner region 320 is present. FIG. 8(d) shows the results of clipping the polygon 314 to the inner region 320. The resulting polygon is a valid representation of the integrated circuit layout in that region, if a similar expansion operation had been applied to the whole layout. In order to be effective the buffer region must be larger than the expansion or shrink amount. In the preferred embodiment this does not pose any particular problems, as the skirt region is much larger than is generally required. This is because the skirt region is sized to be used in the generation of connectivity information and is therefore larger than required for common modification operations.

During the connectivity computation stages, polygons within the skirt region 261 are used along with the polygons in the inner or measurement region 262. Only polygons and parts of polygons that lie in the sample region 260 are considered to be correctly modified and have valid connectivity data. This will be explained in greater detail when discussing property extraction. Within the preferred embodiment after modification and the connectivity operations the skirt region 261 is deleted. All polygons within the inner region are clipped to the boundary of the inner region 262. The inner region 262 is also referred to as the measurement region since this is the region where all the geometry can be assumed to be correctly classified and is the default region from which all the measurements are made. In the preferred embodiment of the present invention the sample region 260 which includes both the sample measurement region 262 and the sample skirt is taken to be 17 times the largest minimum feature size. The measurement region 262 is a square 12 times the largest minimum feature size, surrounded by the skirt region 261 which occupies the remainder of the sample region 260. These sizes have been found to a reasonable compromise for both the connectivity and sizing operations required within the preferred embodiment. In particular, connectivity and non-redundant contact information can be satisfactorily generated using this size of skirt.

Sample Processing

The extraction of sample properties step 46 consists of a series of steps in which the polygon data inside the sample is processed so that valid measurements can be made.

Figure 9A:
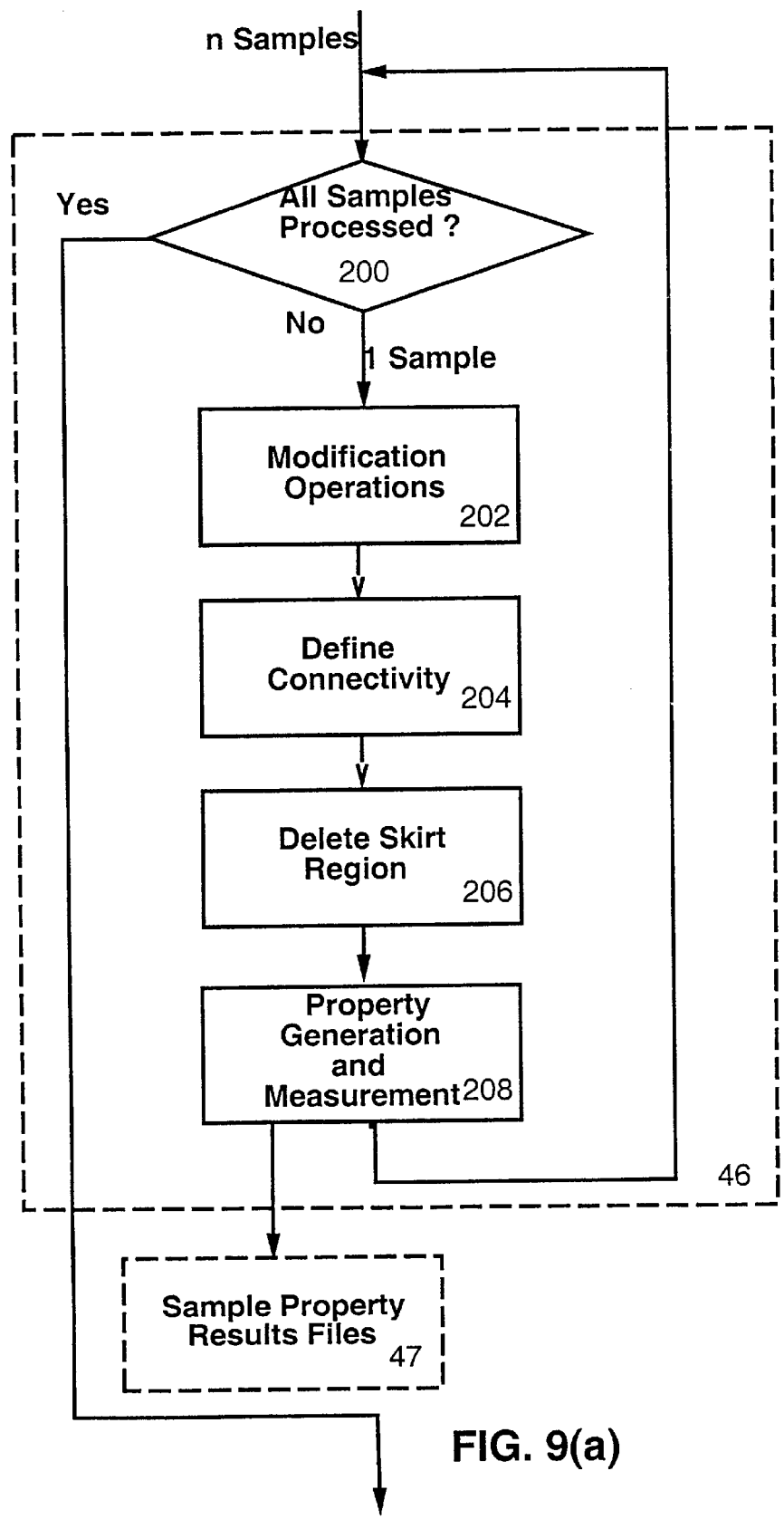
FIGS. 9a and 9b are flowcharts showing the method steps for extraction of sample properties.
Figure 9B:
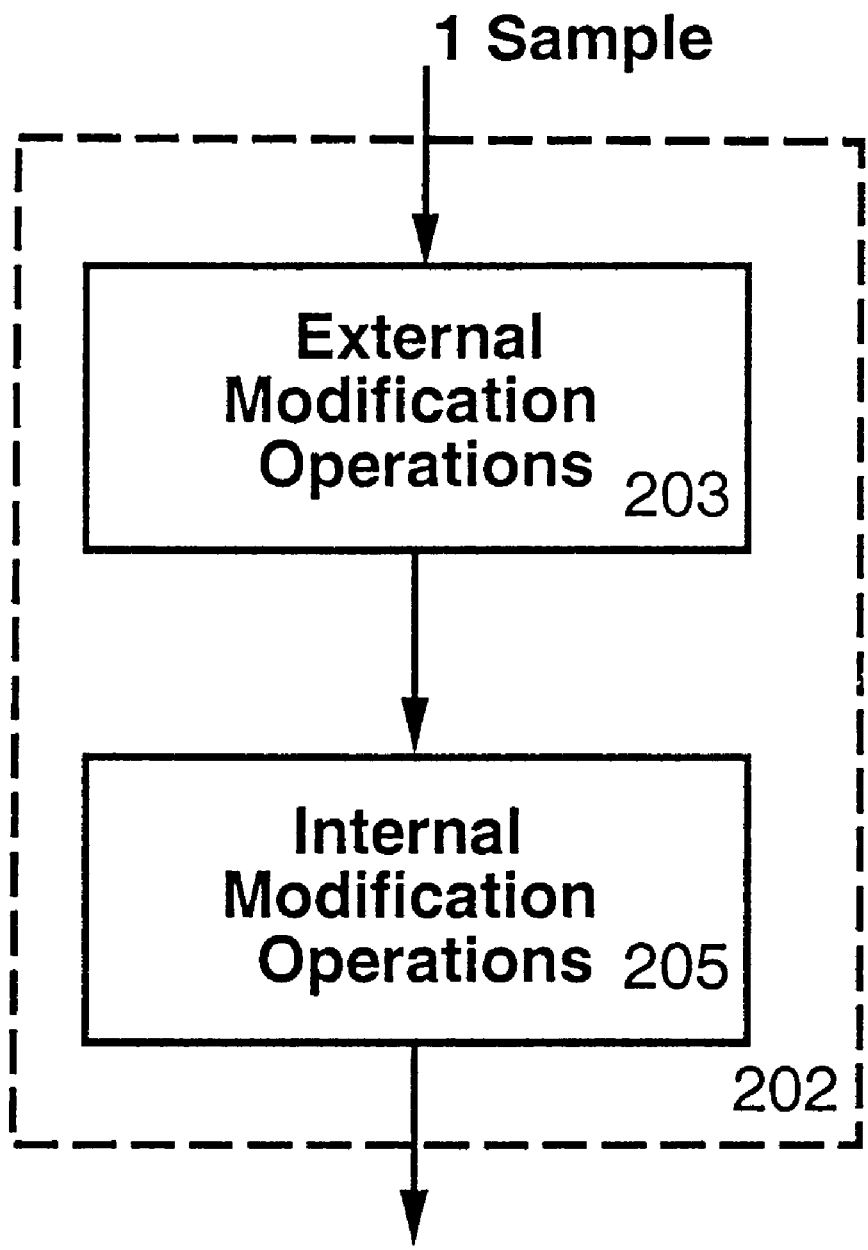

FIG. 9 (a) is a flowchart of the method steps required to generate property measurements from the samples generated by the computer 1 in the sample generation step 43. In the preferred embodiment each sample is processed in turn until all the samples have been processed. The first step 202—see also FIG. 9(b)—is to optionally apply modifications to the sample polygons. There are two mechanisms by which these modifications can be introduced, but both are optional since there are many occasions where no modifications are required. The standard method is to define the required operations in the property extraction control file 45. Many of the operations that are commonly applied are available by this method and are classed as internal modifications 205. However, where more complex modifications are required the sample data is passed to a separate program or set of procedures which act to apply the required transformations and these are classed as external modifications 203.

The next step is a define connectivity step 204 where the connectivity of the polygons including non-redundant contacts and/or via layers, are defined. This step is optional since only some property estimates will require either connectivity or non-redundant contact information. The next step is a delete skirt region step 206. The geometry within the skirt region 260 is no longer required. In this step all the sample geometry is clipped to the boundary of the sample measurement region 262 but connectivity information is preserved. The next step is a property generation and measurement step 208. In this step properties are, optionally, generated and measured. Some simple properties of an integrated circuit, such as the area of a layer, can be measured directly. Other properties, such as the transistor gate area, have to be generated before they can be measured. There is a further class of properties that require special processing of the sample geometry. These properties in general are related to either properties generated from the interaction of polygons at a distance or a count of the number of whole polygons. The next section will describe in detail the extraction of properties from the sample measurement region 262.

Properties are measured within the valid measurement region 264, the default size of which is the measurement region 262. A multiplication factor is applied to the properties measured within the valid measurement region such that they are equivalent to a property measurement taken from the default size. This enables the same population size to be used when calculating properties of the integrated circuit as a whole. Thus the property values written to the sample property results files 47 are scaled by the CPU 3 using the multiplication factor m, where m is given by, $$m = \frac{\text{valid measurement region area}}{\text{measurement region area}}$$

In the preferred embodiment, in general, each property is stored in a separate file within a results directory. However, properties that vary with defect size have all the values of the property for the various defect sizes stored in the same file.

This is done to enable efficient access to the data, since these results are normally combined to give a measure of a single property, the sensitivity to defects of the particular defect type. Within each result file other information is stored that is required to generate property information of the integrated circuit. This includes the device area, the population size, and other appropriate information such as defect size ranges. In the preferred embodiment the population size, N, is taken to be, $$N = \frac{(\text{device width} + \text{measurement region width}) \times (\text{device height} + \text{measurement region height})}{\text{measurement region} \times \text{measurement region height}}$$

Extraction of Sample Properties

Figure 10A:
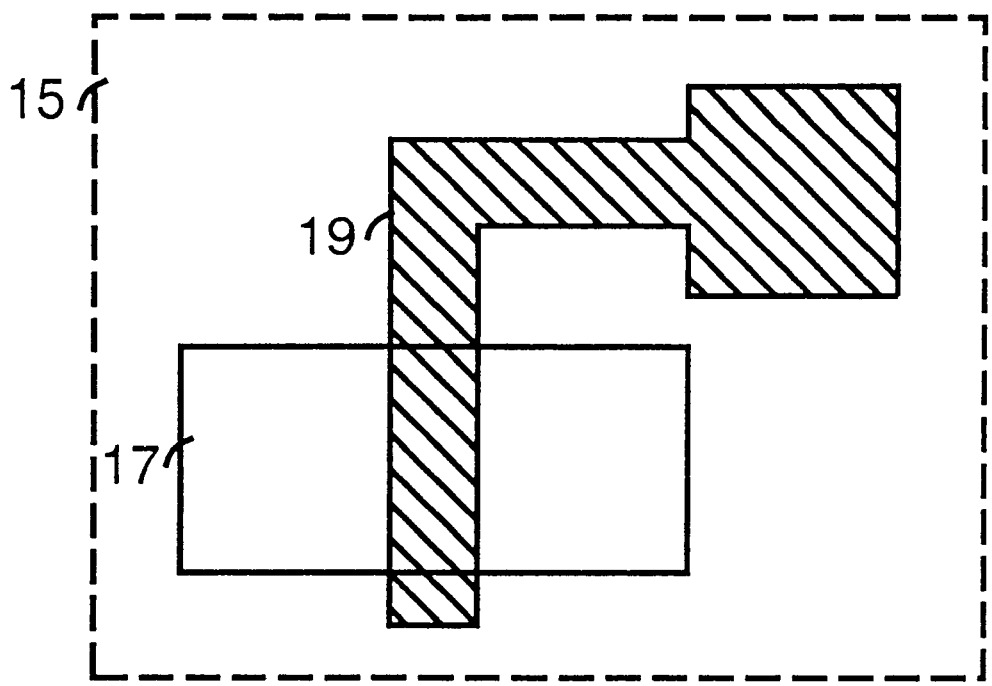
FIGS. 10a and 10b show a Boolean AND operation applied to mask layers resulting in the creation of a new layer.
Figure 10B:
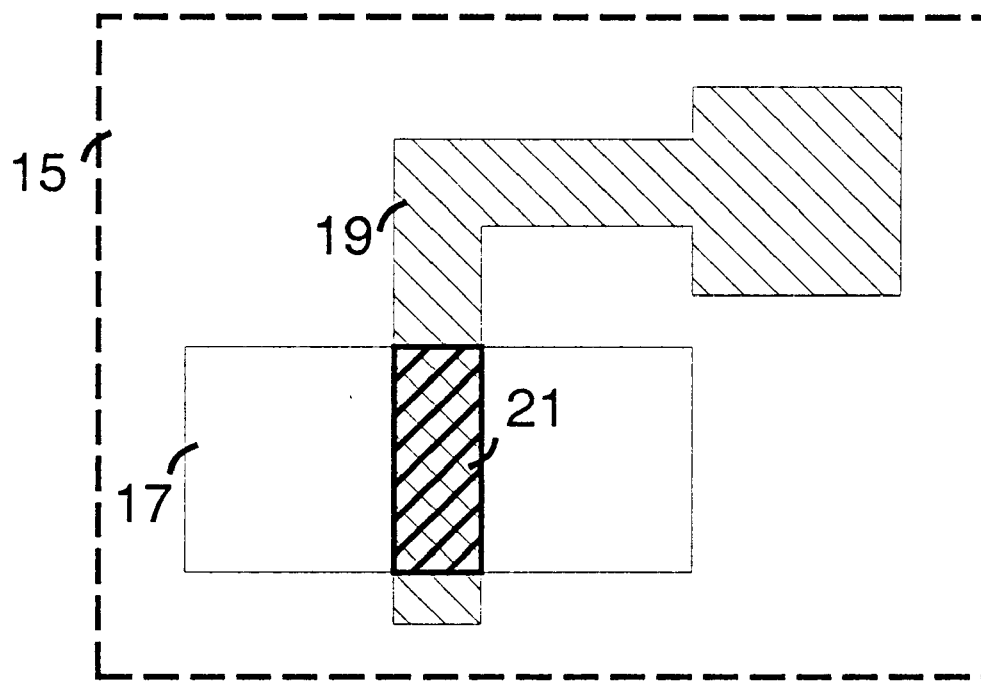

Some device properties can be extracted directly from the sample measurement region using a similar sequence of operations to those that would be used to extract the property of the complete layout. The only difference is that there is less geometry within the sample measurement region 262 than the whole layout. Such properties include the area of a layer and the generation of simple combinations of layers that are subsequently measured. An example of such a property is the transistor gate area in a CMOS circuit. Referring now to FIG. 10, the transistor gate region can be generated by performing a Boolean AND operation between layers representing the active area 17 and the polysilicon 19 and then measuring the area of the resulting layer 21. Boolean operations are not affected by the sampling process since the interaction is based solely within the area defined by the layers to which the operation is applied. In the preferred embodiment Boolean operations can be used during both the modification operations step 202 and the property generation and measurement step 208. In general, unless the generated layer has some other use it is more efficient to generate it during property generation and measurement step 208 since at this stage the sample region 260 has been clipped to the measurement region 262 and generally contains less geometry.

The Importance of Connectivity

An example of a property in which the connectivity of polygons is of importance is pinhole critical area. Pinhole critical area is a measure of an integrated circuit's susceptibility to shorting faults that are the result of very small holes in the dielectric between different conducting layers. The small hole provides a conduction path between electrically separate nodes, causing a circuit fault. These holes are so small that they can be modeled as a point. Pinhole critical area can be generated for two conducting layers of integrated circuit by finding the area where the conductors that belong to separate electrical nodes overlap. The reason that the conductors must belong to separate nodes is that if the conductors are already part of the same electrical node, a further connection by a pinhole in the dielectric will not alter the connectivity and will therefore not cause a fault. The node to which a conductor belongs is dependant on the connections to other layers. Such connections are made by contacts and vias.

Figure 11A:
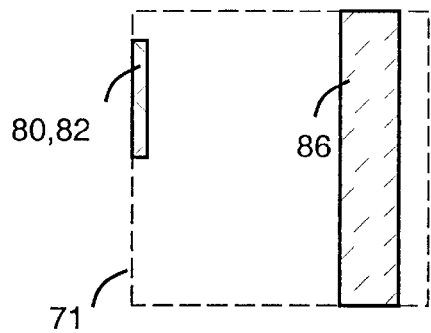
FIGS. 11a to 11d show the use of a sample skirt surrounding the sample measurement region to more accurately estimate the inter-level dielectric pinhole critical area within a sample of an integrated circuit layout.
Figure 11B:
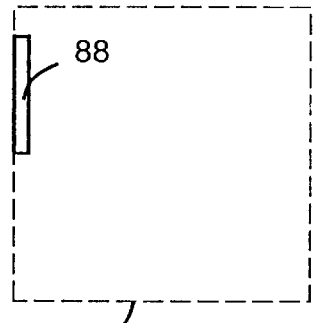
Figure 11C:
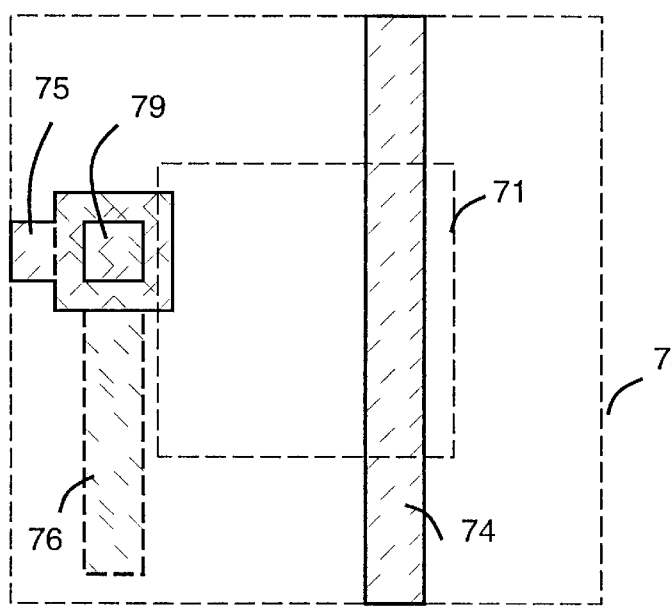
Figure 11D:
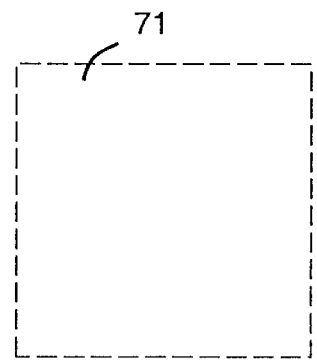

FIG. 11(a) shows a sample of an integrated circuit layout consisting only of a measurement region 71. There are three polygons within this measurement region 71. Two of these polygons 80 and 82 are separate metal layers which overlap each other. A measurement of pinhole critical area for the sample region of FIG. 11(a) for the inter-layer dielectric between the metal layers is given in FIG. 11(b). This shows a polygon 88 corresponding to the overlapped polygons 80 and 82. FIG. 11(c) shows the same measurement region 71 of FIG. 11(a) but has in addition a surrounding sample skirt 73. Polygon 75 corresponds to polygon 80, polygon 76 corresponds to polygon 82 and polygon 74 corresponds to polygon 86. An additional polygon 79 is also present. Polygon 79 is a via, which connects polygons 75 and 76. Thus these two polygons belong to the same node. The pinhole critical area for the measurement region 71 of FIG. 11(c) is shown in FIG. 11(d), in which there is no critical area present. The corresponding region 88 of FIG. 11(b) can now be seen to have been generated in error because insufficient information on the connectivity status of polygon 80 and 82 was available in FIG. 11(a).

Similarly, for identifying non-redundant contacts/vias, the function of the skirt region 261 is to enable contact and via connectivity to polygons to be determined. This ensures that valid information is present to enable contacts and vias within the measurement region 262 to be properly classified.

Figure 12A:
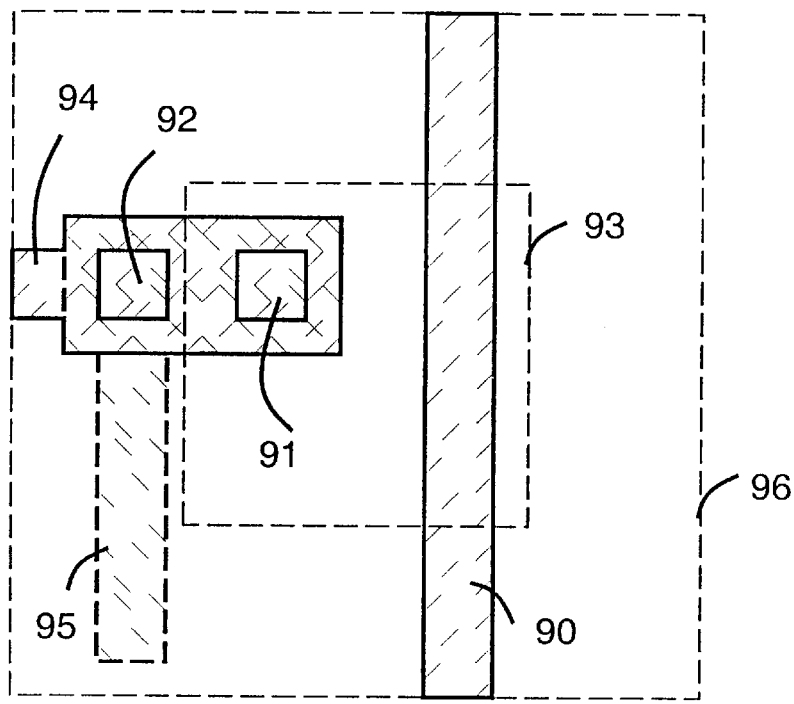
FIGS. 12a to 12d show the use of a sample skirt surrounding the sample measurement region to more accurately generate a layer corresponding to non-redundant vias within a sample of an integrated circuit.
Figure 12B:
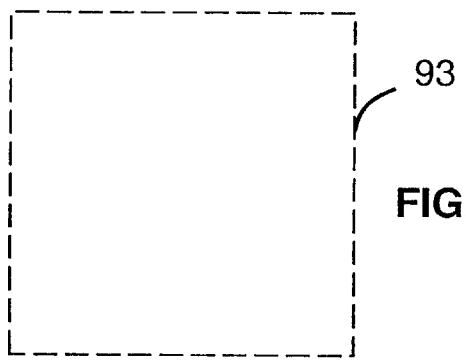
Figure 12C:
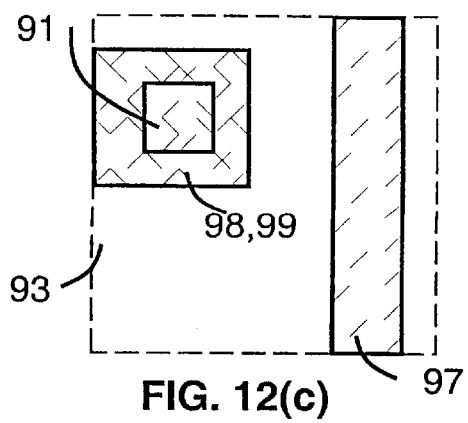
Figure 12D:
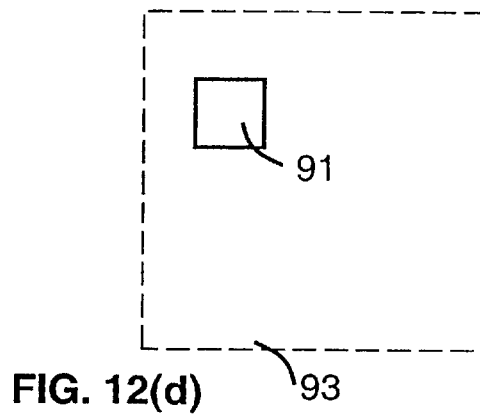

FIG. 12(a) shows a sample taken from an integrated circuit layout. The measurement region 93 is surrounded by a skirt region 95. The polygons 94 and 95 belong to separate layers and are connected together by two vias 91 and 92. A measure of the non-redundant contacts within the measurement region 93 is given in FIG. 12(b), where there are no non-redundant contacts present. The same layout sample of FIG. 12(a) is shown in FIG. 12(c) but only the measurement region 93 is present without the skirt region. In FIG. 12(c) the polygons 98 and 99 overlap and correspond to polygons 95 and 95 respectively. Only one contact 91 is present. A measure of non-redundant contacts for the layout in FIG. 12(c), without using any additional information, would result in the layout given in FIG. 12(d) where contact 91 has been classified as non-redundant. This example indicates that extra information outwith the measurement region is often essential to determine the conditions within the measurement region. An analysis of all the integrated circuit layout may be required to ensure a hundred percent accuracy. However, in the preferred embodiment only a small buffer region of extra layout is used, as this has been found to give the required accuracy.

Interaction at a distance

There are properties of interest that involve the relationship of polygons to their neighbours, where their neighbours may not occupy the same space but are separated by a distance. In general these types of property involve the generation of a new layer, which involves the interaction of distance polygons. Such properties can only be generated where the interaction distance is smaller than the sample measurement region size. Consequently the interaction distance is generally small relative to the size of the integrated circuit itself.

Figure 13A:
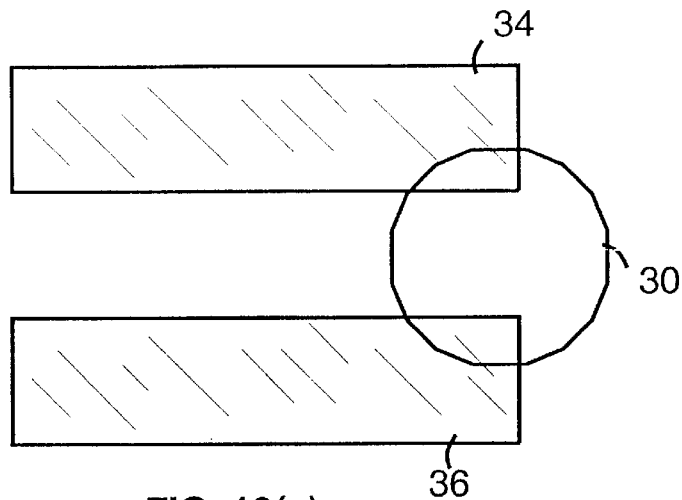
FIGS. 13a to 13c show the extra material critical area region formed by two metal tracks for a particular defect size.
Figure 13B:
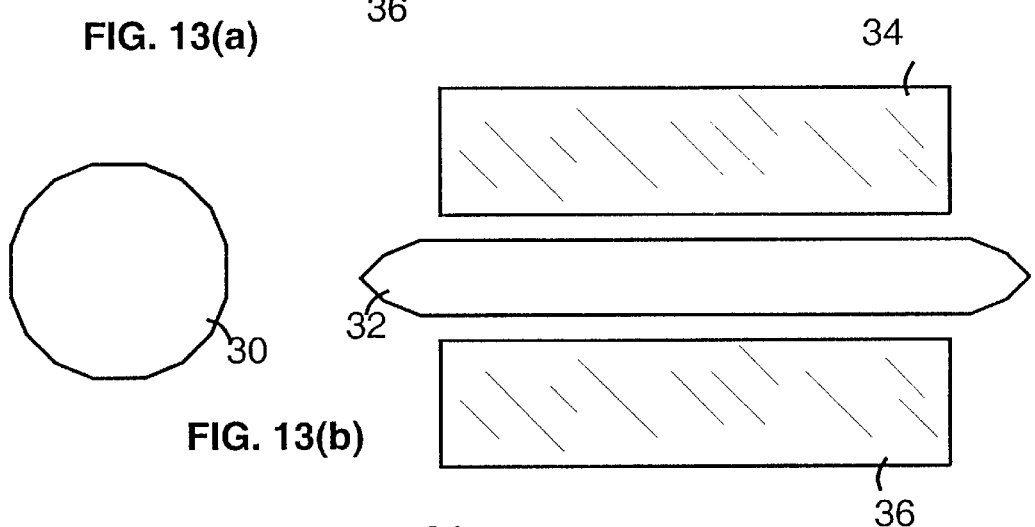
Figure 13C:
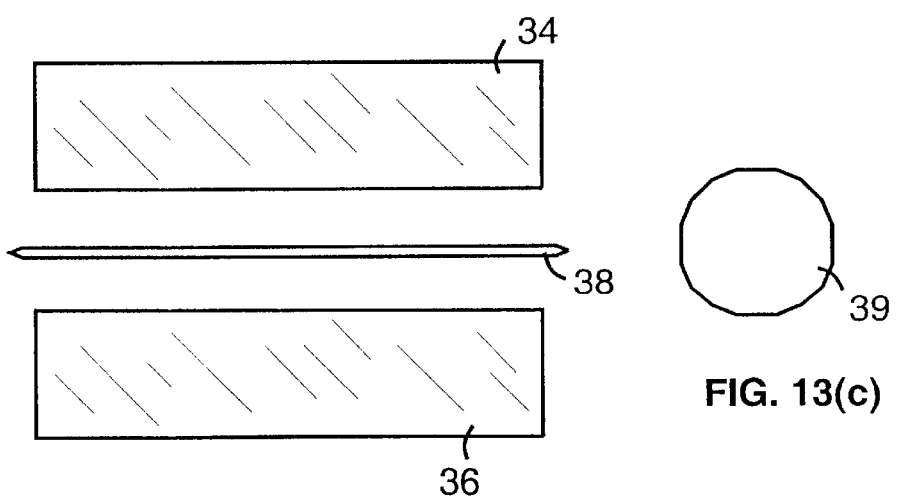

An example of a property that is generated by polygon interaction at a distance is extra material critical area. Extra material critical area is a measure of the susceptibility of integrated circuit layout to extra material defects. Referring now to FIGS. 13(a–c), electrical nodes within an integrated circuit such as metal tracks 34, 36 can be shorted together when a conducting defect 30 connects the tracks. Extra material critical area is the region 32 in which the center of the defect 30 must fall in order to cause a short. The size of this region is dependent on the defect size; larger defects give larger regions and a smaller defect 39 gives a smaller region 38. In order to determine the susceptibility of an integrated circuit layer to extra material defects it is common practice to generate critical areas for a range of discrete defect sizes. The results can be displayed as a graph such as given in FIG. 14.

Figure 15A:
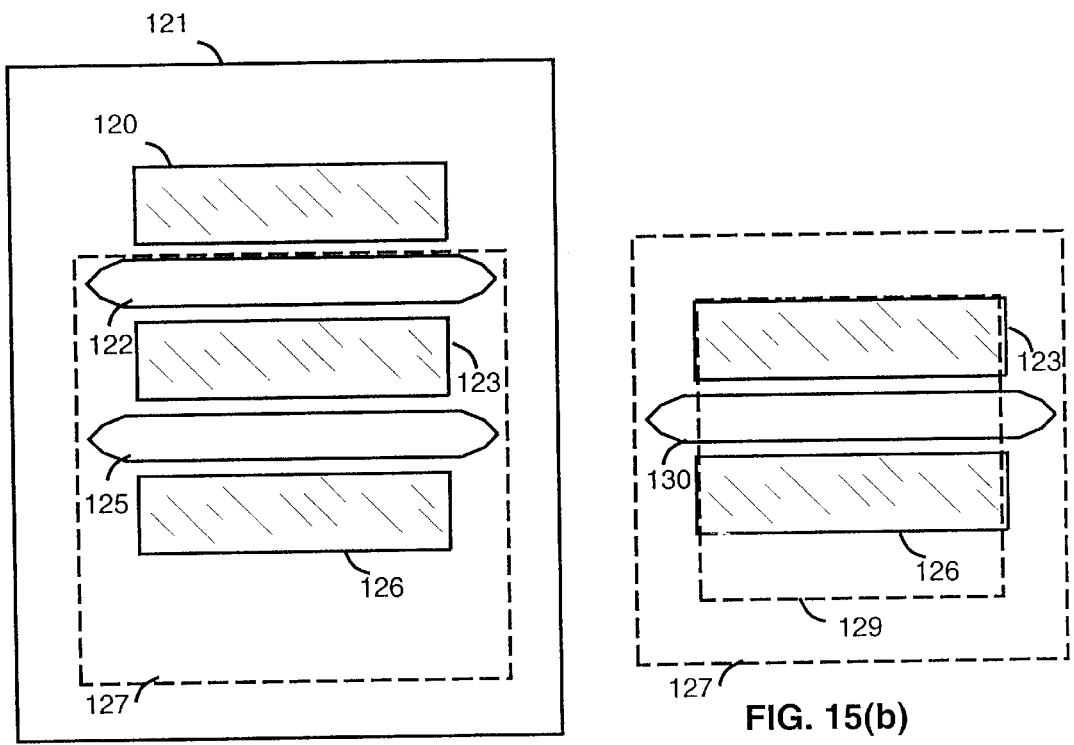
FIGS. 15a to 15c show of the use of a variable valid measurement region within the sample measurement region to enable accurate estimates of extra material critical area.
Figure 15B:
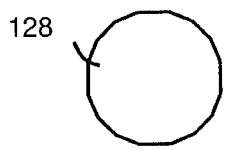
Figure 15C:
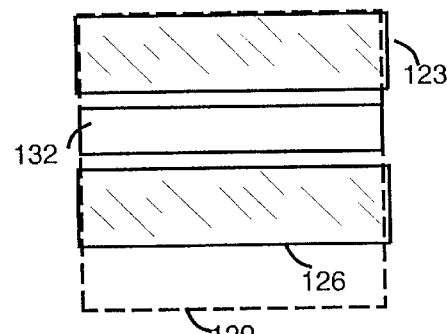

FIG. 15(a) is a representation of part of an integrated circuit. There are three metal tracks 120, 123, 126. Also shown are the extra material critical area regions 122, 125 associated with these tracks, corresponding to a defect size represented by the defect 128. A sample measurement region 127 is marked on FIG. 15(a). In this example, for simplicity, the sample skirt and its effect on connectivity information are ignored. It can be observed that both critical area regions 122, 125 are completely enclosed within the measurement region 127. It can also be observed that the metal track 120 is not enclosed within the sample measurement region 127. FIG. 15(b) is a representation of the sample measurement region 127 taken from the integrated circuit part 121. This sample does not contain the metal track 120. Extra material critical area generated within the measurement region 127 for defects such as 128 results in the generation of region 130. This corresponds to the region 125 of FIG. 15(a). There is no region generated that corresponds to region 122. This implies that a measure of extra material critical area from a measurement region will not accurately reflect the critical area of the same layout in the circuit. This is because the operation involves the interaction of polygons up to a distance of the defect radius. Consequently the extra material critical area region generated within a sample is only valid for part of the sample measurement area, called the valid measurement area 129. This area is the region inside the sample measurement area that can be guaranteed to have an accurate measure of the critical area, identical to that produced that in the same position within the integrated circuit layout. The valid measurement region is generated by shrinking the sample measurement region on all sides by the operation interaction distance, in this case the defect radius. FIG. 15(c) is a representation of the valid measurement region 129 taken from the sample measurement region 127 of FIG. 15(b). The critical area region 132 is a correct measure of the critical area of the integrated circuit for the area defined by the valid measurement region 129. Region 132 corresponds to the critical area region 130, which has been clipped to the valid measurement area boundary to generate region 132. A valid measurement region is used rather than using polygons in the skirt region because the connectivity of geometry in the skirt region cannot be guaranteed. Some local connections to skirt layout geometry may not be present and hence the connectivity information is not accurate enough.

Critical areas are generated for a range of defect sizes and as a result the valid measurement region is not constant but is dependant on the interaction distance, in this case the defect size radius used for the extraction. For non-symmetrical interaction, such as rod or elliptical defects the valid measurement region must be generated accordingly, as will be obvious to those skilled in the art. In general, the measurement region must be sufficiently large to be shrunk by the interaction distance and still leave a non zero valid measurement region. This implies that for a rectangular measurement region and symmetrical interaction the smallest side must be greater than twice the interaction distance. For both extra and missing material critical area the measurement region must be larger than the defect size associated with the critical area. In general operations within a layout sample that involve the interaction of polygons at a distance can only be guaranteed valid within a smaller region inside the sample defined by the interaction distance and called the valid measurement region.

There are many properties that require interaction at a distance operations, such as length of metal edge a given distance from another metal edge etc. However, in the preferred embodiment interaction properties include extra and missing material critical area for single mask layers and combinations of mask layers, to give dielectric critical areas.

Counting Polygons

Figure 16A:
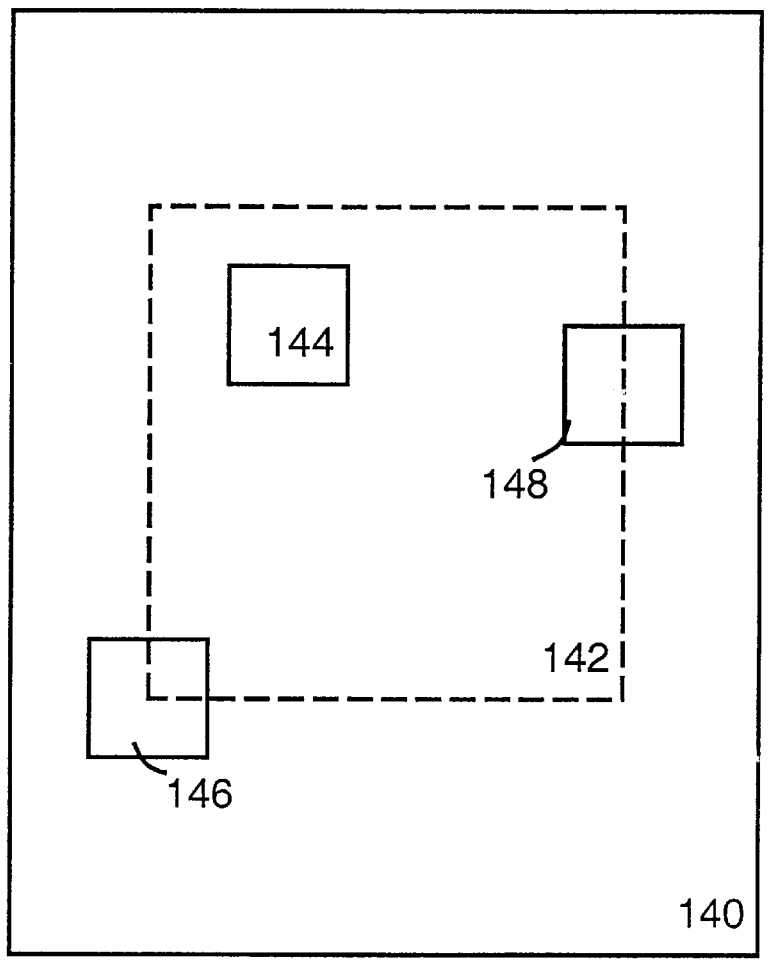
FIGS. 16a and 16b show of the estimation of the number of known fixed sized contacts/vias by sampling.
Figure 16B:
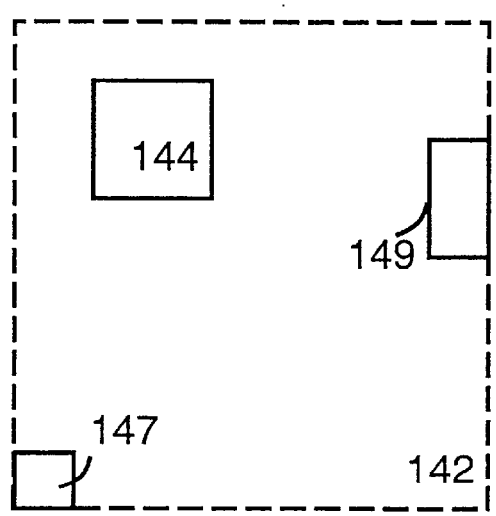

One interesting property of an integrated circuit layout is the number of contacts and vias of different types that are present. Both contacts and vias are small openings in the dielectric which are filled with a conducting substance to connect conductors on different levels of the integrated circuit. FIG. 16(a) shows part of an integrated circuit layout 140. A sample measurement region 142 within the layout is shown. Polygon elements 144, 146 and 148 represent vias. The polygons 146 and 148 fall partially within the measurement region 142. When the measurement region 142 is extracted from the layout 140 polygons 146 and 148 are cut. The is done to all polygons to ensure that very large polygons that commonly occur within integrated circuit layout do not get processed as a whole when only a small fraction of the polygon lies within the sample. FIG. 16(b) gives a representation of the resulting polygons. Element 147 corresponds to element 146 and element 149 corresponds to element 148. In a whole integrated circuit that has not been sampled the number of vias can easily be found by counting the number of via polygons that are present on the layer representing vias. However this approach cannot be used where polygons have been cut, as estimates based on this count would tend to give over-estimates. If a simplifying assumption is made that all contacts are the same size then an estimate can be made using the area of the polygons within the measurement region 142. For FIG. 16(b) this results in 1.75 contacts within the measurement area. In many modern integrated circuit processes vias are a fixed size, defined by the process design rules. For such technologies an estimate of the number of vias can be made by measuring the area of these via polygons within the measurement region and dividing by the fixed via area. The fixed size of the via polygon can be defined by the user within the property extraction control file 43. Also, any vias found to be larger than this fixed size can be excluded from the area measurement. This is based on the assumption that structures larger than the fixed size must have some other function than the "normal" vias. Other uses can include the definition of scribe channels, alignment marks, device wire bond pads etc.

Many integrated circuit technologies, particularly older technologies, do not have design rules which require a fixed contact/via size. Consequently, a range of via sizes is commonly present within the integrated circuit layout. This embodiment of the present invention is a system primarily concerned with estimating properties of integrated circuits that have an impact on the manufacturing yield of the device. Within this framework the goal is to estimate the number of vias that may result in failure. In general large vias are less likely to be a source of failure, and hence yield loss, than small vias. A large via often contains an element of redundancy or serves another function such as an alignment mark or scribe channel. Within this framework it is acceptable to base an estimate on the number of small vias rather than the total number of vias.

To estimate the number of contacts/vias within an integrated circuit by sampling requires an estimate of the number of contacts falling within each sample region. Where, as above, the contacts are equally sized this can be done by measuring the area of the contact layer within the sample and dividing by the contact area. However, where the size of the contacts is unknown this approach would require a measure of the average contact size. An estimate of the total area of the layer divided by an estimate of average contact size would give in turn an estimate of the number of contacts. A more efficient method to give an estimate of the number of variable sized contacts can be obtained by counting the number of contact centers that fall within a region.

Figure 17A:
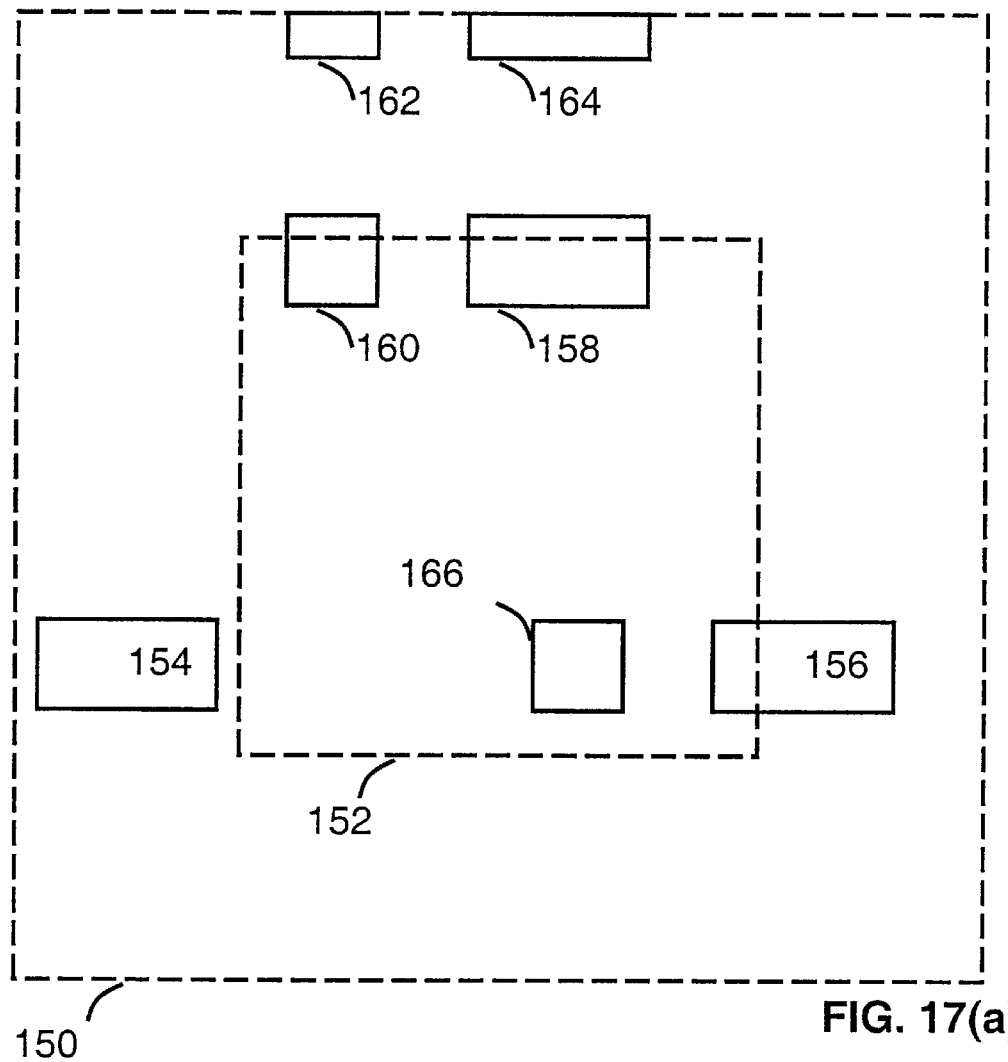
FIGS. 17a and 17b show the estimation of the number of variable sized contacts/vias by sampling.
Figure 17B:
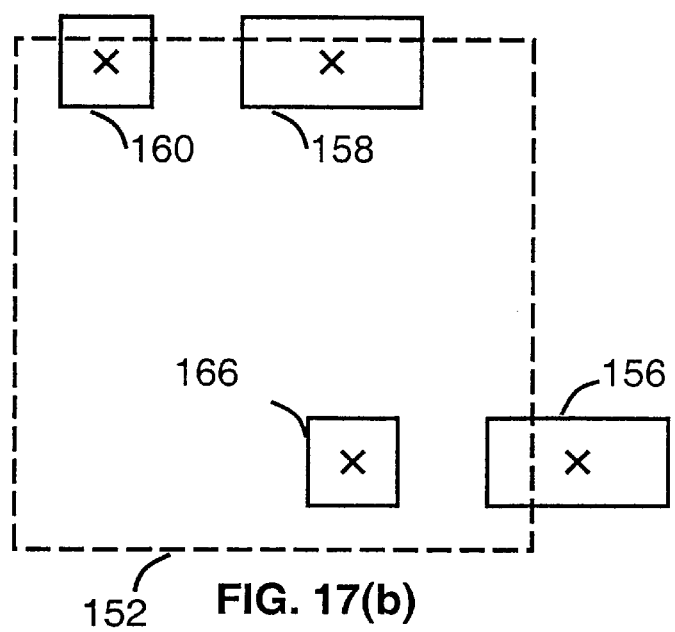

FIG. 17(a) is representation of a sample measurement region 150 taken from an integrated circuit layout. The measurement region 150 contains a number of vias 154, 156, 158, 160, 166. The measurement region also contains two partial vias 162, 164. Partial vias are defined as vias that that share a common boundary with the measurement region. To estimate the number of variable sized vias a smaller region, a valid measurement region 152, is generated that is centered on the measurement region 150. The number of vias centers, excluding partial vias, within the valid measurement region is used as a count of the number of vias. The partial vias are excluded, since their true size is unavailable and hence their centers are not known. It is reasonable to exclude these since only very large partial vias can have their center within the valid measurement region 152. FIG. 17(b) shows the valid measurement region and the vias 156, 158, 160, 166 that fall within it. The centers of the three vias 158, 160 and 156 fall within the valid measurement region. The center of via 156 falls outwith the measurement region and is therefore not included in the count.

Preferably, the valid contact measurement region 152 is a square of side one half the side of the measurement region 150. This results in a valid contact measurement region as a square of six times the largest minimum feature size. It has been found that this gives good estimates of the number of small vias/contacts of varying size within integrated circuit layout. An estimate of the number of vias within the sample measurement region is found by multiplying the count of the via centers found within the valid measurement region by the ratio of measurement region area versus the valid measurement region area. Thus in this embodiment for the sizes of these regions the multiplier is 4. The use of this ratio multiplier is explained in the section on sample processing.

The center counting technique can of course be used for fixed sized vias. However, the valid measurement region is smaller using this technique. In general this results in a greater variance and hence larger errors in the estimation. Consequently it is generally better to use the area counting technique where the via size is known.

The center counting technique can also be used for estimating the number of small polygons other than contacts and vias. For example, it has been used to give estimates of the number of transistors. These estimates are typically lower than the actual number of transistors. This is because there are typically a number of large transistors in a layout that do not get counted using this technique. However, the result is still a good estimate of the complexity of a circuit since the larger transistors are usually associated with buffers rather than logic gates. As a result this a useful method of estimating design complexity quickly. To achieve more accurate results the user can increase the sample region size. This in effect redefines that range of transistors that are classed as large.

Property Estimate from Sample Results

The results generated from a sampled extraction are stored in a set of sample results files 47. The calculation of property values for the integrated circuit is obtained using the statistics of survey sampling. Preferably, the samples are selected, as already described, in such a way as to enable the result to be interpreted as a stratified sample.

Stratified sampling is in many cases an improved method of estimating population parameters or properties. A stratified sample is generated by separating the population into a number of non-overlapping regions, called strata. Stratified sampling can increase the accuracy of population estimates where the selected strata have less variance than the population as a whole.

The estimator of the whole population mean, $\mu$ for a stratified survey is given by the stratified sample average $\bar{y}_{st}$:

$$\hat{\mu} = \bar{y}_{st} = \frac{1}{N}\sum_{i=1}^{L} N_i \bar{y}_i$$

and the estimated variance of $\bar{y}_{st}$ is given by:

$$\hat{V}(\bar{y}_{st}) = \frac{1}{N^2}\sum_{i=1}^{L} N_i^2 \hat{V}(\bar{y}_i)$$

where $N_i$ is the population size of the ith of L strata. The estimator of the population total Y is given by:

$$\hat{Y} = N\bar{y}_{st} = \sum_{i=1}^{L} N_i \bar{y}_i$$

The confidence limits corresponding to the 95% confidence probability for the estimate of the population total Y are given by:

$$\hat{Y} = N\bar{y}_{st} \pm 2N\sqrt{\hat{V}(\bar{y}_{st})}$$

The technique can be usefully applied to the estimation of integrated circuit properties by dividing up the device into a number of regions or strata. The properties of the regions are estimated using a survey sampling technique, such as a simple random sample. In general stratified sampling results in more accurate estimates of device properties with smaller bounds on the error of estimation.

Figure 18A:
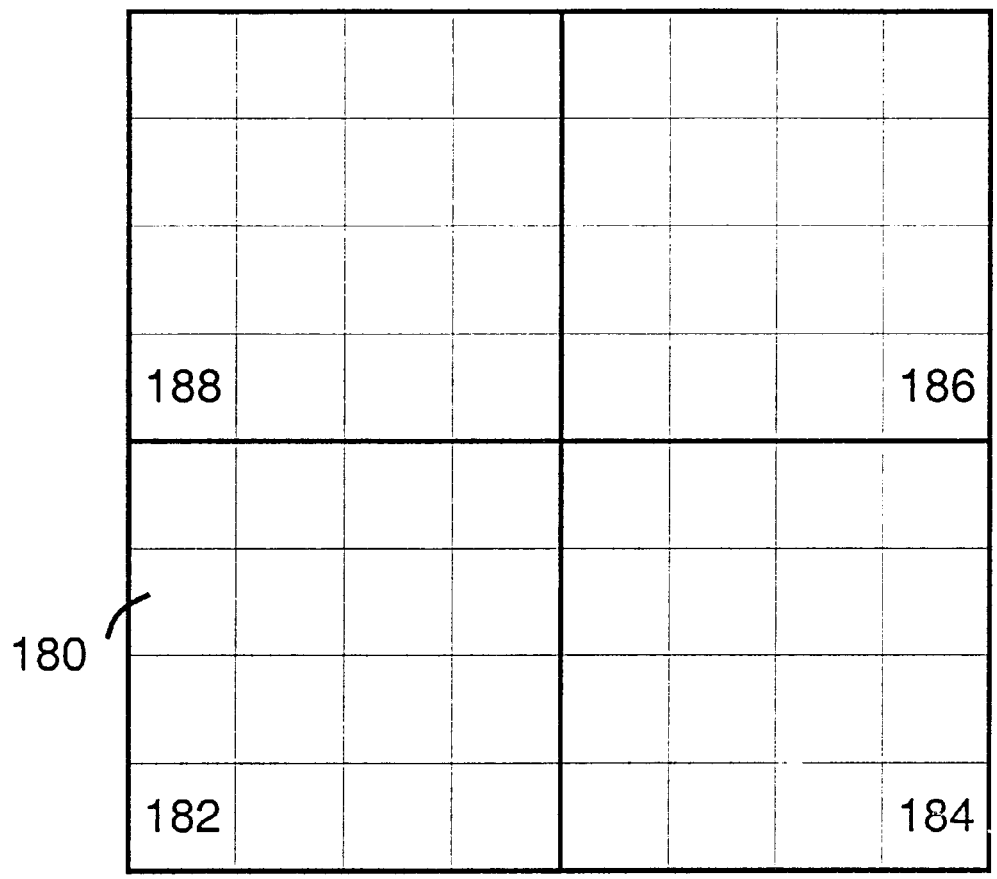
FIGS. 18a and 18b are integrated circuit representations showing device regions and their collection into strata.
Figure 18B:
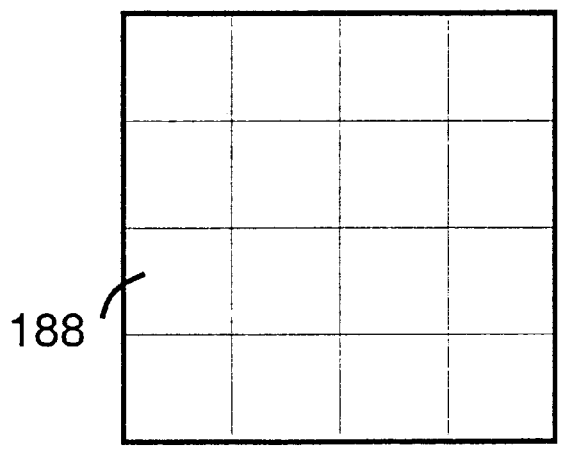

Referring now to FIGS. 18(a) and (b) the number of samples used is restricted by the use of sampling levels. The sampling levels have been chosen to enable the generation of equally sized strata with 16 samples in each strata. Strata 182, 184, 186, 188 are generated by selecting four by four regular blocks of device regions. Each strata thus contains 16 sample regions and hence 16 sampled values. Thus a sampling level of 1 uses 512 samples, which are combined to form 32 strata; sampling level 2 has 1024 samples and therefore 64 strata, level 3 has 2048 samples and 128 strata etc. The mean, total and estimation errors for the property are calculated by the CPU 3 using the well known statistics of survey sampling.

Figure 19:
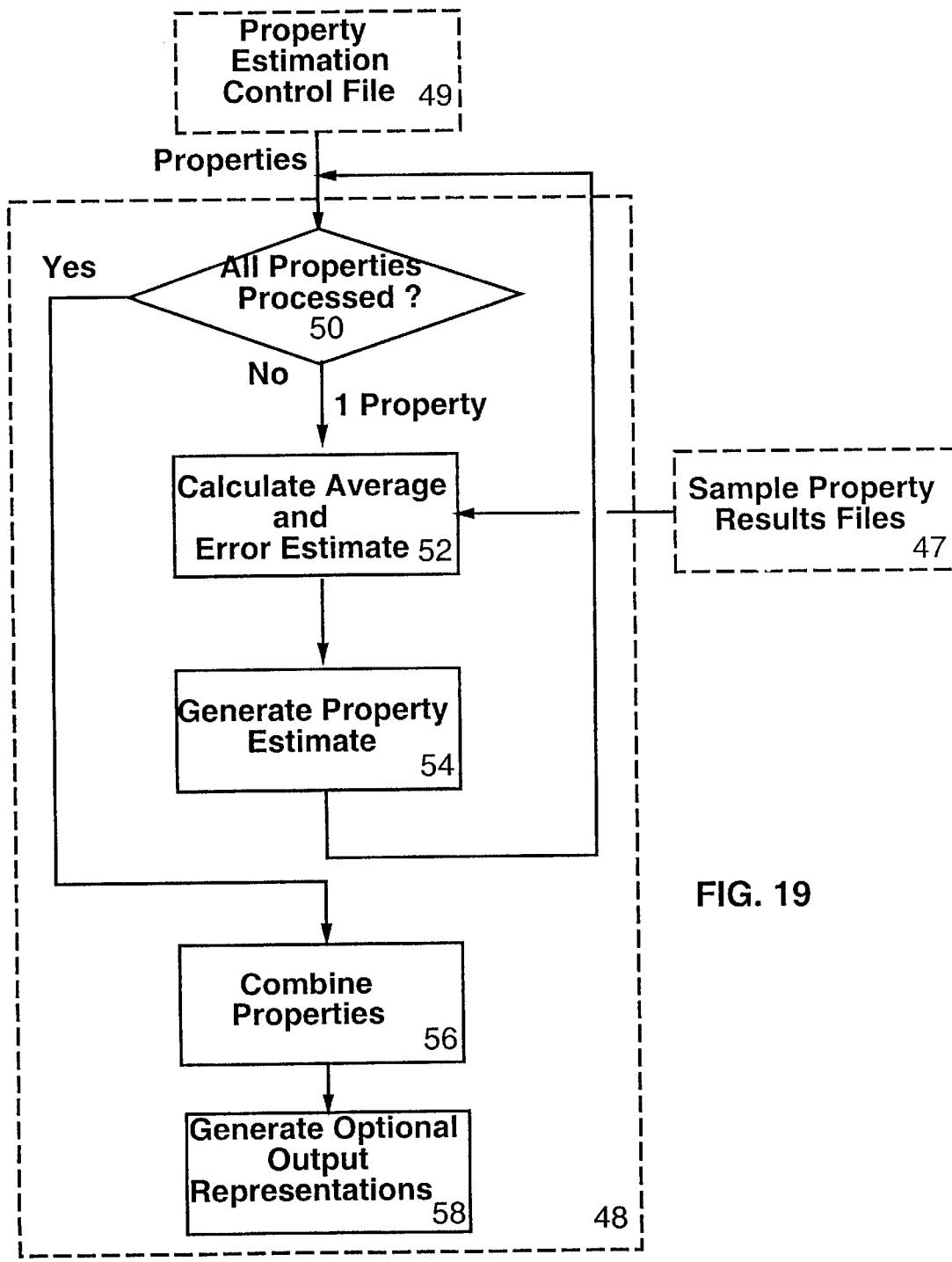
FIG. 19 is a flowchart showing the method steps for integrated circuit property estimation from sample results files, in the preferred embodiment of the present invention.

FIG. 19 shows the method steps for integrated circuit property estimation 48. In step 50 the CPU 3 checks to determine whether all the properties listed in the property estimation control file 49 have been processed. If they have all been processed it proceeds to a combine properties step 56. If a property remains to be calculated the CPU 3 reads the property name, associated defect statistics and yield model from the property estimation control file 49. The CPU also reads the appropriate sample property results file determined from the property name. This information is used in step 52 to estimate a mean value of the property and an estimate of the error of that value. In generate property estimate step 54, an estimate of the desired property is generated. The properties of interest, in general, relate to the manufacturability of the integrated circuit. In particular the desired property is usually an estimate of the average number of faults from a particular defect mechanism. Given an estimate of a device defect sensitivity, defect data and yield model, those skilled in the art can generate an estimate of the average number of faults associated with the defect mechanism. Such estimates are generated within step 54 in the preferred embodiment.

After all the properties are generated they are combined. In the preferred embodiment the combination of the estimated properties step 56, the average number of faults from each defect mechanism are combined to give an estimate of the total yield loss associated with these mechanisms. More details are given below.

Figure 14:
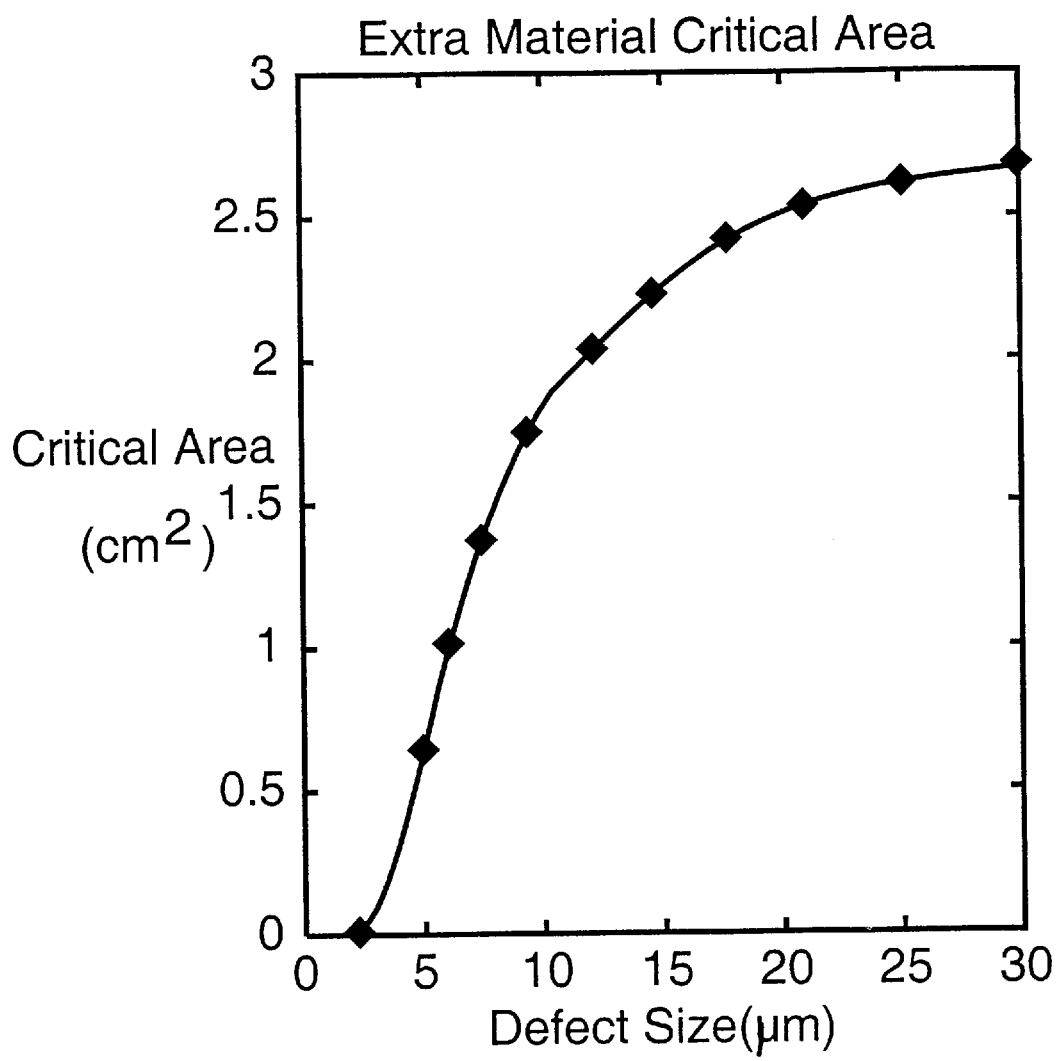
FIG. 14 is a graph of extra material critical area against defect size.

The preferred embodiment of the present invention permits a range of output formats and representations of the properties estimated. This takes place within the generate optional output representations step 58. Data can be output as a single value representing a combination of multiple properties. Data can also be output as files suitable for generating graphs of values against defect size. Such a graph is shown in FIG. 14. The data can also be presented as a map of the device, either for a single property, typically a defect mechanism, or as a combination of properties or defect mechanisms. These maps are generated by plotting a normalised gray level in a map of device regions. Each device region is shaded according to the value of the property extracted from the single sample, extracted from the region.

Yield prediction and error bounds

There are a number of yield models reported in the literature that relate fault probability to device yield. Two such models are the Poisson model $$Y_{Tot} = Y_0 \prod_{j=1}^{k} e^{-\lambda_j}$$

and the negative binomial model $$Y_{Tot} = Y_0 \prod_{j=1}^{k} \left(1 + \frac{\lambda_j}{\alpha_j}\right)^{-\alpha_j}$$

where $Y_o$ is factor which acts as an adjustment to take into account any non-random defects, $\lambda_j$ is the average number of faults per chip of type j and $\alpha_j$ is a measure of the defect clustering. The value of $\lambda_j$ is determined using the estimated defect sensitivity of the device to the defect type and the associated defectivity data from the manufacturing process.

The choice of yield model and parameters is dependent on the yield of the chip, since no model will fit all the data over a very broad range of chip yields and most models can be made to give good estimates over a limited range of yields. As a consequence, the known yields of devices are used to determine the yield model parameters which are then used to estimate the yield of the device being examined. The yield prediction will be valid so long as the new device yield falls roughly within the existing data set. The "better" the yield model the greater the region in which valid predictions can be obtained.

The bounds on the error of the yield prediction can be calculated by substituting the lower/upper error bounds of the average number of faults, for each defect type, into the yield model to determine the upper/lower error bound on the yield. However, this may result in inaccurate error bounds since fault mechanisms are normally correlated to some degree. More accurate error bounds can be generated if this is taken into account.

There are a number of methods for combining variables with error bounds known to those skilled in the art. In this example, a method is used which takes advantage of the problem domain. In particular, the preferred embodiment makes use of a property of the Poisson model which allows a single term $\lambda_{dev}$, the average number of device faults, to be derived from the sum of the average number of faults for each defect type.

$$Y_{Tot} = Y_0 e^{-\lambda_{dev}}$$

$$\lambda_{dev} = \sum_{j=1}^{k} \lambda_j$$

The sampled mean of $$\overline{\lambda_{dev}}, \sum_{i=1}^{n} \frac{\lambda_{dev(i)}}{n},$$

is equal to the sum of the sample means $$\overline{\lambda_j}, \sum_{j=1}^{k} \overline{\lambda_j}$$

but the bounds of error on $\overline{\lambda_{dev}}$ are not the same and are typically smaller.

When the Poisson yield model is used to predict yield, the error bounds of $\lambda_{dev}$ are used directly to give the bounds of the predicted yield. For other models the result are applied indirectly by using the property that yield models give good results within a small range. Since in general the error bounds are small, a new yield model is generated from the prediction of the existing model $Y_{Tot}$. Hence, the new model, which is based on the Poisson model, gives the same yield prediction using the term $\lambda_{dev}$ and a constant clustering factor $C_f$.

$$C_f = \frac{-\ln \frac{Y_{Tot}}{Y_0}}{\lambda_{dev}}$$

$$Y_{Tot} = Y_0 e^{-C_f \lambda_{dev}}$$

This model is then used to give the error bounds on the original prediction.

Conclusions

The extraction of properties of integrated circuits from a representation is a mature field. In particular much work has been done to characterize the susceptibility of integrated circuits to defects. The inventive research in this field has focused on faster algorithms and more efficient methods of processing the increasingly large amount of data used to describe state of the art devices. Hierarchical analysis techniques have been developed to reduce the amount of duplicate data processed. Parallel analysis has been combined with hierarchical analysis to enable this reduce amount of data to be processed more quickly by using extra hardware.

The solution adopted in the present invention cuts across the grain of the present research effort. It is the result of the recognition that not all the description of an integrated circuit needs to be analysed, in order to measure its properties. Neither does an analysis require the selection of functional blocks or characteristic partitions. The properties of an integrated circuit can in fact be found by analysing a sufficiently large number of diverse samples of the representation. A sampling scheme can be used such that individual samples do not have to be selected as characteristic of the device or part of the device. The samples can therefore be small and randomly selected without special knowledge. It is the large number of these samples and their distribution that make them representative of the device as a whole.

The implementation of the present invention is significantly simpler than the complex systems that have been developed, by those skilled in the art, to implement hierarchical extraction with cell interaction. The preferred embodiment of the present invention is a modified version of a hierarchical extractor, that did not include the effects of cell interactions.

Other Embodiments of the Invention

It will be clear, to those skilled in the art, in the light of the teaching presented here that there are other possible embodiments of the invention. In particular, existing tools for geometry manipulation can be used to perform a similar set of operations. These tools are commonly used within the design and fabrication of integrated circuit and often take the form of design rule checkers. A commonly used tool is the Dracula design rule checker produced by Cadence Design Systems, Inc of San Jose. In the preferred embodiment of the present invention samples are taken one at a time from the representation and processed. Using a design rule checker it would be straight forward, for those skilled in the art, to generate a masking layer of sample regions. This masking layer could be used to generate the required samples using a Boolean AND operation or other operators. This would reduce the amount of mask data to only that present within the sample regions. Property estimation of these regions could then be performed, in the light of the these regions could then be performed, in the light of the present teaching, either on the set of data as a whole or on parts of the data. If the data is operated on as a whole there is some difficulty in generating an estimate of the error. However, if a large number of samples are used, the error is small and can generally be safely ignored.

Design rule checker tools are widely used to estimate device properties and can be easily adapted for use with the present invention.

It will be appreciated by those skilled in the art that the present invention can be embodied in other specific forms without departing from the spirit or essential characteristics thereof. The presently disclosed embodiments are therefore considered in all respects to be illustrative and not restrictive. The scope of the invention is indicated by the appended claims and all changes that come within the meaning and range of equivalents thereof are intended to be embraced therein.

What is claimed is:

1. A method for determining at least one property of an integrated circuit having layout geometry comprising:
   (a) creating a multiplicity of samples of layout geometry of said integrated circuit, wherein the samples are taken at random locations with respect to layout object locations;
   (b) determining, on the basis of each of said samples, a measurement of said at least one property of said circuit; and
   (c) determining, on the basis of said measurement, an estimate of said at least one property of said integrated circuit.

2. The method of claim 1, wherein the creating step (a) comprises the additional step of modifying the layout geometry within said samples.

3. The method of claim 1, wherein the creating step (a) comprises the additional step of determining the connectivity of layout geometry elements within said samples.

4. The method of claim 3, wherein the creating step (a) comprises the steps of:
   (i) creating a multiplicity of samples of the layout geometry of said integrated circuit, with an additional skirt region surrounding each of said samples; and
   (ii) determining, on the basis of the layout geometry within said samples and the associated skirt region, the connectivity of layout geometry elements within said samples.

5. The method of claim 1, wherein the determining step (b) comprises:
   (i) determining valid measurement regions within said samples; and
   (ii) determining, on the basis of said samples and the associated valid measurement regions, a measurement of said at least one property.

6. The method of claim 1, wherein the size of said samples is small, such that a multiplicty of said samples represent a fraction of said integrated circuit layout geometry.

7. The method of claim 1, wherein said at least one property is selected from the group consisting of layer area, transistor gate area, susceptibility to defects, susceptibility to extra material defects, susceptibility to missing material defects, susceptibility to pinhole defects, susceptibility to dielectric defects, element number, via and contact number, manufacturability, layout modifications and the effects of layout modifications on other properties.

8. The method of claim 1, comprising the additional step of:
   (d) determining the error bounds associated with said estimate of said at least one property of said integrated circuit.

9. The method of claim 1, wherein the creating step (a) comprises stratified sampling.

10. The method of claim 1, wherein the at least one property is a plurality of properties.

11. Apparatus for estimating at least one property of an integrated circuit from a representation of said integrated circuit, the apparatus comprising:
   (a) means for creating a multiplicity of small samples from said representation, wherein the samples are taken at random locations with respect to layout object locations;
   (b) means for estimating said at least one property of said samples; and
   (c) means for estimating said at least one property of said integrated circuit from the sample estimate of said at least one property.

12. The apparatus of claim 11, wherein the means for extracting a multiplicity of small samples additionally comprises a means for modifying the contents of said samples.

13. The apparatus of claim 11 wherein the means for estimating said at least one property of said samples comprises:
   (i) means for generating valid measurement regions within said samples; and
   (ii) means for estimating said at least one property within said valid measurement regions.

14. The apparatus of claim 11 further comprising:
   (d) means for estimating the error bounds associated with the estimate of said at least one property of said integrated circuit.

15. The apparatus of claim 11, wherein the at least one property is a plurality of properties.

* * * * *